(12) United States Patent
Miyasaka et al.

(10) Patent No.: US 10,636,353 B2
(45) Date of Patent: Apr. 28, 2020

(54) ELECTRO-OPTICAL DEVICE AND ELECTRONIC APPARATUS

(71) Applicant: SEIKO EPSON CORPORATION, Tokyo (JP)

(72) Inventors: Mitsutoshi Miyasaka, Suwa (JP); Yoichi Momose, Matsumoto (JP); Kiyoshi Sekijima, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/233,849

(22) Filed: Dec. 27, 2018

(65) Prior Publication Data

US 2019/0197947 A1    Jun. 27, 2019

(30) Foreign Application Priority Data

Dec. 27, 2017   (JP) ................ 2017-250718

(51) Int. Cl.
*G09G 3/3225*    (2016.01)
*G09G 3/20*    (2006.01)
(Continued)

(52) U.S. Cl.
CPC ....... *G09G 3/3225* (2013.01); *G02B 27/0172* (2013.01); *G09G 3/003* (2013.01);
(Continued)

(58) Field of Classification Search
CPC .... G09G 3/3225; G09G 3/003; G09G 3/2022; G09G 3/3258; G09G 2300/0842;
(Continued)

(56) References Cited

U.S. PATENT DOCUMENTS 4,928,266 A * 5/1990 Abbott ............... G11C 7/20
365/154
6,518,945 B1 * 2/2003 Pinkham ............ G09G 3/3648
345/100

(Continued)

FOREIGN PATENT DOCUMENTS

JP    2002-287695 A    10/2002
JP    2004-062199 A     2/2004

(Continued)

OTHER PUBLICATIONS

Notice of Reasons for Refusal, Japanese Patent Application No. 2017250718, dated Jun. 5, 2019. (Year: 2019).*

*Primary Examiner* — Julie Anne Watko
(74) *Attorney, Agent, or Firm* — Oliff PLC

(57) ABSTRACT

An electro-optical device a pixel circuit located at a position corresponding to an intersection of a scan line and a data line, a first potential line supplies a first potential, a second potential line supplies a second potential, and a third potential line supplies a third potential. The pixel circuit includes a light emitting element and a memory circuit. The memory circuit that is disposed between the first potential line and the second potential line, and that includes a first transistor. A source of the first transistor is electrically connected to the first potential line. The light emitting element is disposed between a drain of the first transistor and the third potential line. An absolute value of a potential between the first potential and the second potential is smaller than an absolute value of a potential between the third potential and the second potential.

10 Claims, 10 Drawing Sheets

(51) Int. Cl.
  *G09G 3/3258* (2016.01)
  *G11C 11/419* (2006.01)
  *G02B 27/01* (2006.01)
  *G09G 3/00* (2006.01)

(52) U.S. Cl.
  CPC ......... *G09G 3/2022* (2013.01); *G09G 3/3258* (2013.01); *G02B 27/017* (2013.01); *G02B 2027/0118* (2013.01); *G02B 2027/0178* (2013.01); *G09G 2300/0842* (2013.01); *G09G 2300/0857* (2013.01); *G09G 2320/0233* (2013.01); *G09G 2330/021* (2013.01); *G11C 11/419* (2013.01)

(58) Field of Classification Search
  CPC ... G09G 2300/0857; G09G 2320/0233; G09G 2300/021; G02B 2027/0178; G02B 27/0172; G02B 27/017; G02B 2027/0118; G11C 11/419
  See application file for complete search history.

(56) References Cited

U.S. PATENT DOCUMENTS

| | | | |
|---|---|---|---|
| 6,965,365 B2* | 11/2005 | Nakamura | G09G 3/3618 345/100 |
| 7,209,101 B2* | 4/2007 | Abe | G09G 3/3233 315/169.3 |
| 2001/0043173 A1 | 11/2001 | Troutman | |
| 2002/0070913 A1 | 6/2002 | Kimura et al. | |
| 2002/0075252 A1* | 6/2002 | Lee | G09G 3/3659 345/211 |
| 2002/0140642 A1* | 10/2002 | Okamoto | G09G 3/3258 345/76 |
| 2002/0158829 A1* | 10/2002 | Yamazaki | G09G 3/3266 345/92 |
| 2002/0158858 A1* | 10/2002 | Tsutsui | G09G 3/3648 345/204 |
| 2007/0159417 A1 | 7/2007 | Miyake | |
| 2013/0278324 A1* | 10/2013 | Kaneyasu | H03K 3/012 327/390 |
| 2014/0211546 A1* | 7/2014 | Jung | G11C 11/412 365/154 |
| 2015/0239258 A1 | 8/2015 | Yano et al. | |

FOREIGN PATENT DOCUMENTS

| | | |
|---|---|---|
| JP | 2004-163601 A | 6/2004 |
| JP | 2007-147963 A | 6/2007 |
| JP | 2007-206681 A | 8/2007 |
| JP | 2014-215495 A | 11/2014 |
| JP | 2015-157391 A | 9/2015 |

* cited by examiner

ELECTRO-OPTICAL DEVICE AND ELECTRONIC APPARATUS

BACKGROUND

1. Technical Field

The present invention relates to an electro-optical device and an electronic apparatus.

2. Related Art

In recent years, Head-Mounted Displays (HMDs) have been proposed that are a type of electronic apparatus that enables formation and viewing of a virtual image by directing image light from an electro-optical device to the pupil of an observer. One example of the electro-optical device used in these electronic apparatuses is an organic Electro Luminescence (EL) device that includes an organic EL element as a light-emitting element. The organic EL devices used in head-mounted displays are required to achieve higher resolution, pixel miniaturization, multi-gray-scale display, and reduced power consumption.

In known organic EL devices, when a selecting transistor is brought to an ON-state by a scan signal supplied to a scan line, an electrical potential based on an image signal supplied from a data line is maintained in a capacitive element connected to the gate of a driving transistor. When the driving transistor is brought into the ON-state according to the potential maintained in the capacitive element, namely, the gate potential of the driving transistor, a current in amount according to the gate potential of the driving transistor flows to the organic EL element, and the organic EL element emits light at luminance according to the current amount.

In this way, the gray-scale display is performed by analog driving that controls the current flowing through the organic EL element according to the gate potential of the driving transistor in a typical organic EL device. Thus, variations in voltage-current characteristics and a threshold voltage of the driving transistor cause variations in brightness and shifts in gray-scale between pixels. As a result, display quality may decrease. In contrast, a memory integrated display element is conceivable that is an organic EL device including memory circuits each provided in a corresponding pixel and including inverters annularly connected together, each of the inverters including a P-type transistor and an N-type transistor, the organic EL device being digitally driven to provide display (see, e.g., JP-A-2002-287695).

According to the configuration of the organic EL device described in. JP-A-2002-287695, a potential of an output of an output inverter (11a) electrically connected to a light-emitting element has, depending on a potential of an input signal, one of the following two values: High, which corresponds to a reference potential turning the light-emitting element into an emission state, and Low, which corresponds to a ground potential turning the light-emitting element into a non-emission state. In a pixel selected by a selection circuit, when the potential of the output of the output inverter is set High, electrical communication is established through a path leading front a power supply for supply of the reference potential, through the P-type transistor of the output inverter and the light-emitting element, to a ground line corresponding to the ground potential, and thus a light-emitting element emits light. Furthermore, when the potential of the output of the output inverter (11a) is High, an output of the other inverter (11b) is Low, and this potential is fed back to an input of the output inverter (11a).

However, in the organic EL device described in JP-A-2002-287695, the power supply voltage causing operation of the memory circuit is the same as the power supply voltage causing the light-emitting element to emit light. Thus, when the power supply voltage is increased to allow the light-emitting element to emit bright light, a gate length or a gate width of each of the transistors needs to be increased to prevent malfunction. This hinders promotion of an increased number of pixels for increased definition and reduces an operating speed of the memory circuit. On the other hand, the power supply voltage needs to be reduced to promote an increased number of pixels for increased definition or to operate the memory circuit at a high speed. This leads to a decreased luminance of the light-emitting element. Therefore, the related art has the disadvantage that achieving both high-luminance light emission from the light-emitting element and display of high-definition images or a high speed operation of the memory circuit is difficult. The organic EL device described in JP-A-2002-287695 also has the disadvantage that the light-emitting element may fail to emit light in some cases when the light-emitting element is to emit light.

SUMMARY

The invention is made to address at least some of the above-described issues, and can be realized as the following aspects or application examples.

APPLICATION EXAMPLE 1

An electro-optical device according to Application Example 1 includes a scan line a data line, a first potential line supplying a first potential, a second potential line supplying a second potential, a third potential line supplying a third potential, a pixel circuit located at a position corresponding to an intersection of the scan line and the data line, the pixel circuit including a light-emitting element and a memory circuit, the memory circuit includes a first inverter that includes a first transistor, and the memory circuit is disposed between the first potential line and the second potential line, a source of the first transistor electrically connected to the second potential line, a drain of the first transistor, and the light-emitting element disposed between the drain of the first transistor and the third potential line, and A<B, wherein A is an absolute value of a potential difference between the first potential and the second potential, and B is an absolute value of a potential difference between the third potential and the second potential.

According to the configuration of Application Example 1, the light-emitting element is disposed between the third potential line and the drain of the first transistor with the source electrically connected to the second potential line. That is, the first transistor and the light-emitting element are disposed in series between the second potential line and the third potential line, and the drain of the first transistor s an output of a first inverter. Therefore, an image signal written to a memory circuit may be used to turn the first transistor included in the first inverter into an ON-state or an OFF-state, allowing the light-emitting element to be placed in an emission state or a non-emission state. Furthermore, an absolute value of the potential difference between the first potential and the second potential is smaller than an absolute value of the potential difference between the third potential and the second potential. Thus, the first potential and the second potential supplied to the memory circuit constitute a low-voltage power-supply, and the third potential and the second potential supplied to the light-emitting element constitute a high-voltage power-supply. The memory circuit is therefore operated by the low-voltage power-supply, allowing the transistors constituting the memory circuit to be miniaturized and operated at a high speed. On the other hand, the high-voltage power-supply causes the light-emitting element to emit light, enabling an increase in luminance of the light-emitting element. This enables provision of an electro-optical device allowing the memory circuit to operate at a high speed and also allowing the light-emitting element to emit light at a high luminance, achieving bright state. Furthermore, the transistors constituting the memory circuit may be miniaturized, providing smaller pixel circuits to allow high-definition images to be displayed brightly.

APPLICATION EXAMPLE 2

In the electro-optical device according to Application Example 2, Expression 1 below is preferably satisfied, wherein $V_1$ is the first potential, $V_2$ is the second potential, $V_3$ is the third potential, $R_T$ is ON-resistance of the first transistor, and $R_{EL}$, is a resistance of the light-emitting element during light is emitted from the light-emitting element.

[Expression 1]

$$R_T < \frac{V_1 - V_2}{2V_3 - V_1 - V_2} \cdot R_{EL} \quad (1)$$

According to the configuration of Application Example 2, the ON-resistance $R_T$ of the first transistor, to which the potential difference between the third potential and the second potential is applied, and the resistance $R_{EL}$ of the light-emitting element during light emission are set to conditions represented by Expression 1. This allows a potential drop due to the ON-resistance $R_T$ of the first transistor during light emission from the light-emitting element to be smaller than a logic-inversion potential of the first inverter. In other words, the potential drop due to the ON-resistance $R_T$ of the first transistor during light emission from the light-emitting element may be made smaller than an intermediate potential between the first potential and the second potential, which is the logic-inversion potential of the first inverter. This enables logical inversion of the first inverter to be suppressed, allowing the light-emitting element to emit light when the light-emitting element is to emit light.

APPLICATION EXAMPLE 3

Preferably, in the electro-optical device according to Application Example 3, the first transistor is of a first conductivity type, the memory circuit includes the first inverter and a second inverter, the a second inverter includes a second transistor of the first conductivity type, and a gate width of the first transistor is larger than a gate width of the second transistor.

According to the configuration of Application Example 3, in the memory circuit, a gate width of the first transistor included in the first inverter is larger than a gate width of the second transistor included in that second inverter and having a conductivity type identical to the conductivity type of the first transistor. Thus, a large current causing the light-emitting element to emit light may be passed through the first transistor, and the ON-resistance of the first transistor in the ON-state may be reduced to decrease the potential drop due to the first transistor when the light-emitting element emits light. On the other hand, the second transistor for static storage operations has a smaller gate width than the first transistor, thus allowing the second transistor to be miniaturized and operated at a high speed.

APPLICATION EXAMPLE 4

Preferably, in the electro-optical device according to Application Example 4, the first transistor is of a first conductivity type, the memory circuit includes the first inverter and a second inverter, the first inverter includes a third transistor of a second conductivity type different from the first conductivity type, the second inverter includes a second transistor of the first conductivity type and a fourth transistor of the second conductivity type, and a gate width of the third transistor is larger than a gate width of the fourth transistor.

According to the configuration of Application Example 4, the first inverter includes the first transistor and the third transistor of the conductivity type different from the conductivity type of the first transistor. The second inverter includes the second transistor of the conductivity type identical to the conductivity type of the first transistor and the fourth transistor of the conductivity type identical to the conductivity type of the third transistor. The gate width of the third transistor is larger than the gate width of the fourth transistor, thus enabling a reduction in the ON-resistance of the third transistor in the ON-state. This enables a reduction in a difference in ON-resistance between the third transistor and the first transistor to make the logic-inversion potential of the first inverter closer to the intermediate potential between the second potential and the first potential. The first inverter can thus be stably operated. In this case, the small ON-resistance of the first transistor allows the passage, through the first transistor, of a large current causing the light-emitting element to emit light, and enables a reduction in the potential drop due to the first transistor when the light-emitting element emits light. On the other hand, a gate width of the fourth transistor is smaller than a gate width of the third transistor, enabling a reduction in the gate width of the second transistor and in the gate width of the third transistor. This in turn enables a reduction in a difference in ON-resistance between the fourth transistor and the second transistor to make the logic-inversion potential of the second inverter closer to the intermediate potential between the second potential and the first potential. The second inverter can thus be stably operated. Thus, when the light-emitting element emits light, the first inverter and the second inverter can be stably operated. Furthermore, the second inverter can be miniaturized and thus operated at a high speed.

APPLICATION EXAMPLE 5

Preferably, in the electro-optical device according to Application Example 5, the first transistor is of a first conductivity type, the memory circuit includes the first inverter and a second inverter, the second inverter includes a second transistor of the first conductivity type and a fourth transistor of a second conductivity type different from the first conductivity type, and a gate length of the first transistor is larger than a gate length of at least one of the second transistor and the fourth transistor.

According to the configuration of Application Example 5, a gate width of the first transistor disposed between the second potential line and the third potential line in series with the light-emitting element is larger than a gate width of one of the other transistors included in the memory circuit. Thus, a large current causing the light-emitting element to emit light may be passed through the first transistor, and the first transistor may be less susceptible to destruction even in a case where a maximum voltage of the high-voltage power-supply is applied to the first transistor. On the other hand, at least one of the other transistors in the memory circuit for static storage operations has a smaller gate length than the first transistor, thus allowing the memory circuit to be miniaturized and operated at a high speed.

APPLICATION EXAMPLE 6

Preferably, the electro-optical device according to Application Example 6 includes a fifth transistor disposed between the data line and an output of the second inverter, wherein an ON-resistance of the fifth transistor is lower than an ON-resistance of the second transistor and the fourth transistor.

According to the configuration of Application Example 6, the fifth transistor disposed between the data line and the output of the second inverter offers a lower ON-resistance than the second transistor and fourth transistor included in the second inverter. Thus, a potential drop due to the ON-resistance of the fifth transistor may be made smaller than a potential drop due to the ON-resistance of the second transistor or the fourth transistor, when an image signal is supplied, through the data line, to an input of the first inverter, i.e., the output of the second inverter. This allows the image signal to be reliably written to the first inverter through the data line or to be reliably rewritten through the data line.

APPLICATION EXAMPLE 7

Preferably, the electro-optical device according to Application Example 7 includes a sixth transistor disposed between a complementary data line and an output of the first inverter, wherein an ON-resistance of the sixth transistor is lower than an ON-resistance of the first transistor and the third transistor.

According to the configuration of Application Example 7, the sixth transistor disposed between the complementary data line and the output of the first inverter offers a lower ON-resistance than the first transistor and third transistor included in the first inverter. Thus, a potential drop due to the ON-resistance of the sixth transistor may be made smaller than a potential drop due to the ON-resistance of the first transistor or the third transistor, when a complementary image signal is supplied, through the complementary data line, to an input of the second inverter, i.e., the output of the first inverter. This allows the complementary image signal to be reliably written to the second inverter through the complementary data line or to be reliably rewritten through the complementary data line.

APPLICATION EXAMPLE 8

Preferably, in the electro-optical device according to Application Example 8, a sixth transistor disposed between a complementary data line and an output of the first inverter, wherein a gate of a fifth transistor and a gate of the sixth transistor are electrically connected to the scan line, a potential of a scan signal supplied to the scan line is a fourth potential, and an absolute value of a potential difference between the fourth potential and the second potential is larger than an absolute value of a potential difference between the first potential and the second potential.

According to the configuration of Application Example 8, an absolute value of the potential difference between the second potential and the fourth potential of the scan signal supplied to the gate of the fifth transistor and the gate of the sixth transistor is larger than an absolute value of the potential difference between the first potential and the second potential corresponding to the potential of the image signal. Thus, compared to a case where the potential of the scan signal is the first potential, Application. Example 8 increases the absolute value of a gate-source voltage of each of the fifth transistor and the sixth transistor in the ON-state. This enables a reduction in the ON-resistance of each of the fifth transistor and the sixth transistor in the ON-state.

APPLICATION EXAMPLE 9

In the electro-optical device according to Application Example 9, the third potential is preferably equal to the fourth potential.

According to the configuration of Application Example 9, the third potential of the high-voltage power-supply is used as the fourth potential, which is the potential of the scan signal. This allows setting of the potential of the scan signal to be achieved without any need to newly provide the potential of the scan signal.

APPLICATION EXAMPLE 10

An electronic apparatus according to Application Example 10 includes the electro-optical device described in the above application examples.

According to the configuration of Application Example 10, high quality of an image displayed in the electronic apparatus such as a head-mounted display can be achieved.

BRIEF DESCRIPTION OF THE DRAWINGS

The invention will be described with reference to the accompanying drawings, wherein like numbers reference like elements.

DESCRIPTION EXEMPLARY EMBODIMENTS

Hereinafter, exemplary embodiments of the invention will be described with reference to drawings. Note that, in each of the drawings below, to make each layer, member, and the like recognizable in terms of size, each of the layers, members, and the like are not to scale.

Outline of Electronic Apparatus

Figure 1:
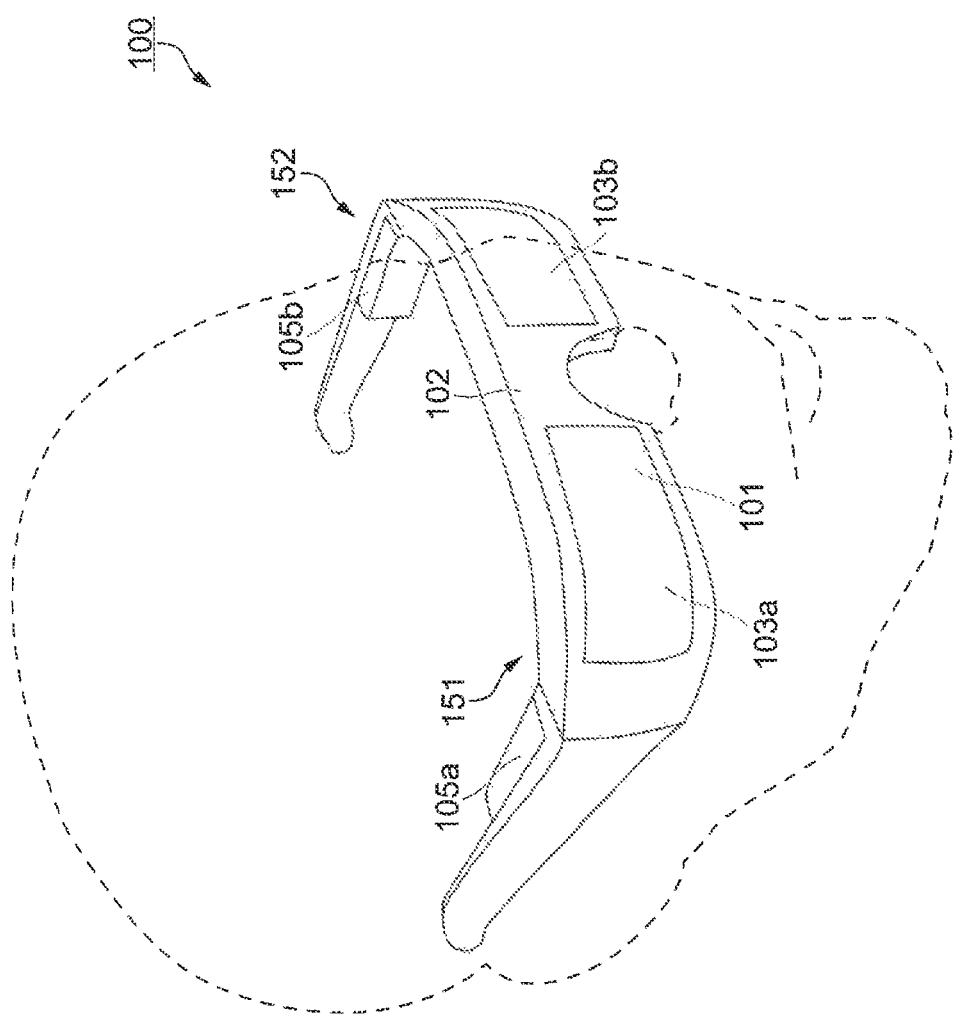
FIG. 1 is a diagram illustrating an outline of an electronic apparatus according to the present exemplary embodiment.

First, an outline of an electronic apparatus will be described with reference to FIG. 1. FIG. 1 is a diagram illustrating an outline of an electronic apparatus according to the present exemplary embodiment.

Figure 3:
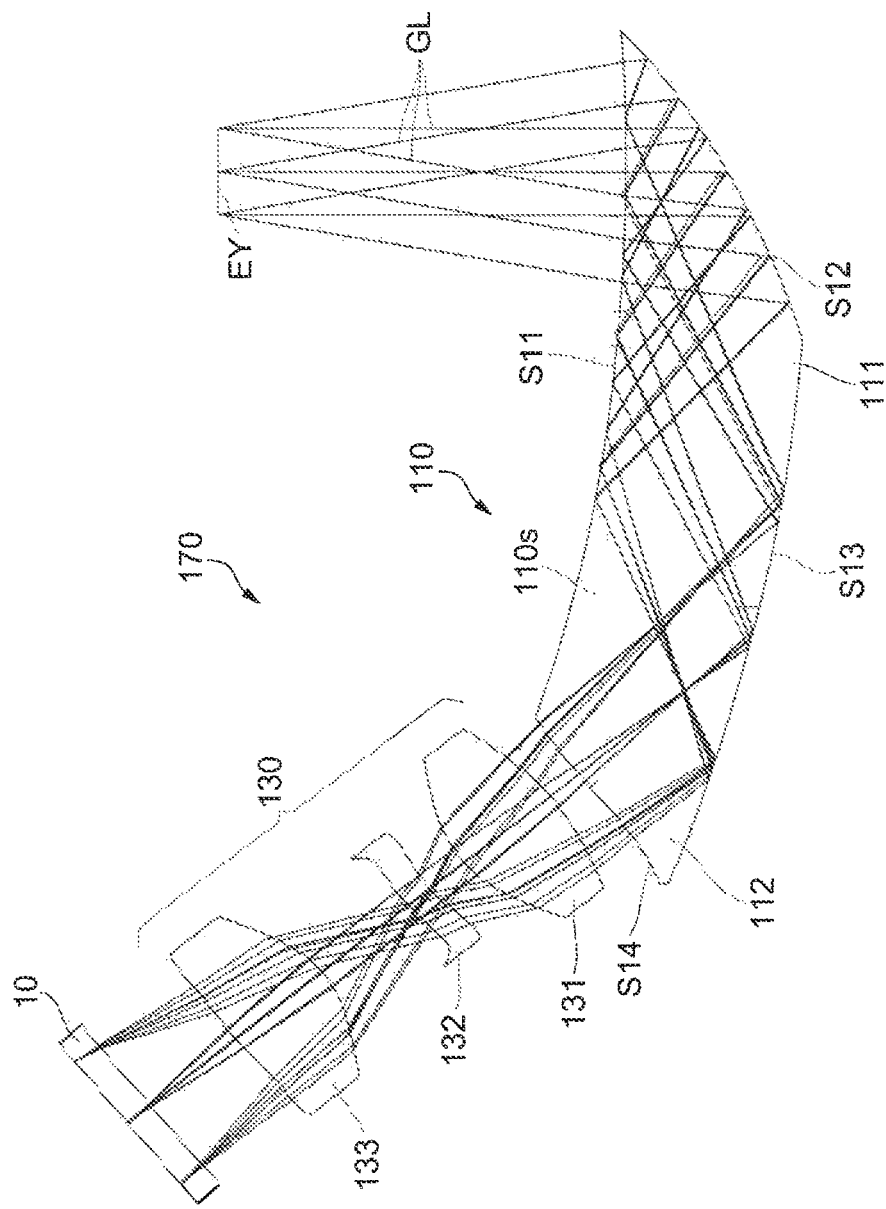
FIG. 3 is a diagram illustrating an optical system of the electronic apparatus according to the present exemplary embodiment.

A head-mounted display 100 is one example of the electronic apparatus according to the present exemplary embodiment, and includes an electro-optical device 10 (see FIG. 3). As illustrated in FIG. 1, the head-mounted display 100 has an external appearance similar to a pair of glasses. The head-mounted display 100 allows a user who wears the head-mounted display 100 to view image light GL of an image (refer to FIG. 3) and allows the user to view extraneous light as a see-through image. In other words, the head-mounted display 100 has a see-through function of superimposing the extraneous light over the image light GL to display an image, and has a small size and weight while having a wide angle of view and high performance.

The head-mounted display 100 includes a see-through member 101 that covers the front of user's eyes, a frame 102 that supports the see-through member 101, and a first built-in device unit 105*a* and a second built-in device unit 105*b* attached to respective portions of the frame 102 extending from cover portions at both left and right ends of the frame 102 over rear side pieces (temples).

The see-through member 101 is a thick, curved optical member that covers the front of user's eyes, and is also referred to as a transmission eye cover. The see-through member 101 is separated into a first optical portion 103*a* and a second optical portion 103*b*. A first display apparatus 151 illustrated on the left side of FIG. 1 that combines the first optical portion 103*a* and the first built-in device unit 105*a* is a portion that displays a see-through virtual image for the right eye and can alone serves as an electronic apparatus having a display function. A second display apparatus 152 illustrated on the right side of FIG. 1 that combines the second optical portion 103*b* and the second built-in device unit 105*b* is a portion that forms a see-through virtual image for the left eye and can alone serve as an electronic apparatus having a display function. The electro-optical device 10 (see FIG. 3) is incorporated in each of the first display apparatus 151 and the second display apparatus 152.

Internal Structure of Electronic Apparatus

Figure 2:
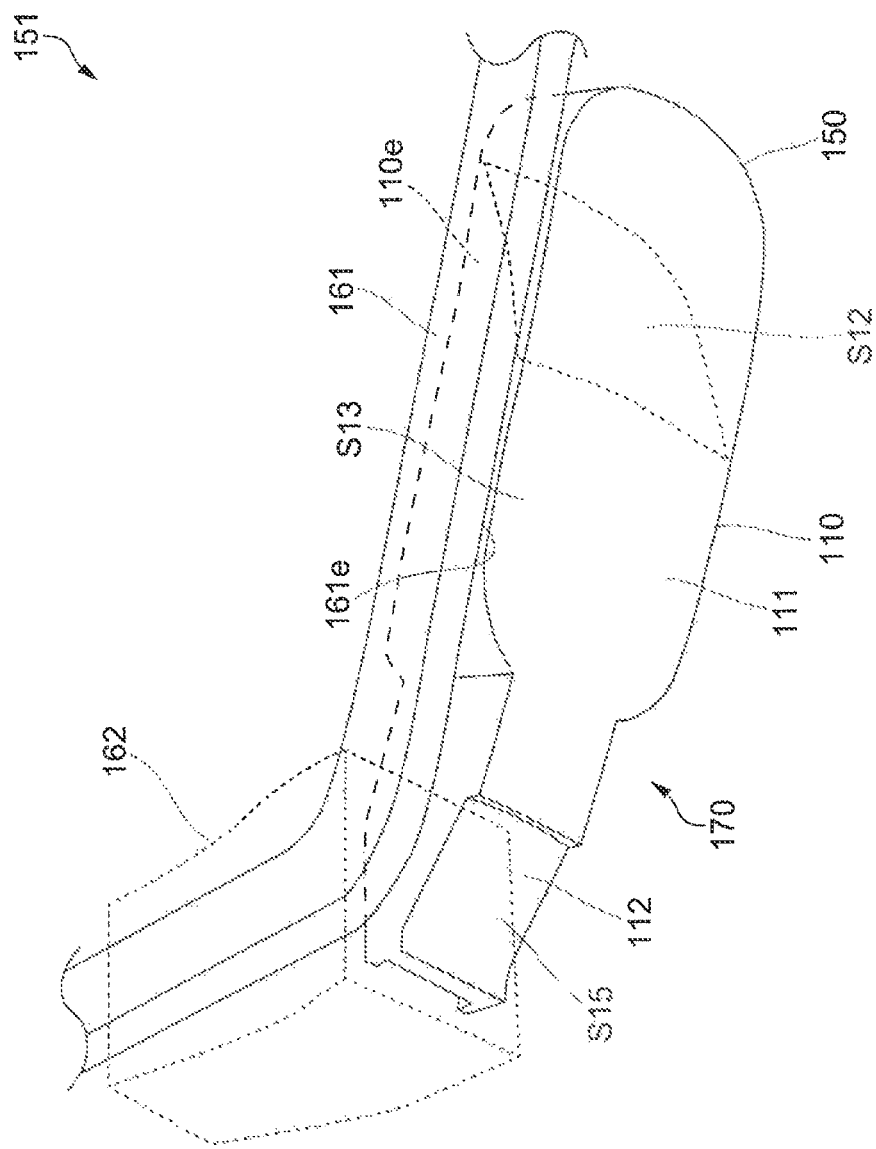
FIG. 2 is a diagram illustrating an internal structure of the electronic apparatus according to the present exemplary embodiment.

FIG. 2 is a diagram illustrating the internal structure of the electronic apparatus according to the present exemplary embodiment. FIG. 3 is a diagram illustrating an optical system of the electronic apparatus according to the present exemplary embodiment. Next, the internal structure and the optical system of the electronic apparatus will be described with reference to FIGS. 2 and 3. While FIG. 2 and FIG. 3 illustrate the first display apparatus 151 as an example of the electronic apparatus, the second display apparatus 152 is symmetrical to the first display apparatus 151 and has substantially the same structure. Accordingly, only the first display apparatus 151 will be described here and detailed description of the second display apparatus 152 will be omitted.

As illustrated in FIG. 2, the first display apparatus 151 includes a see-through projection device 170 and the electro-optical device 10 (see FIG. 3). The see-through projection device 170 includes a prism 110 to serve as a light-guiding member, a light transmission member 150, and a projection lens 130 for image formation (see FIG. 3). The prism 110 and the light transmission member 150 are integrated together by bonding and are securely fixed on a lower side of a frame 161 such that an upper surface 110*e* of the prism 110 contacts a lower surface 161*e* of the frame 161, for example.

The projection lens 130 is fixed to an end portion of the prism 110 through a lens tube 162 that houses the projection lens 130. The prism 110 and the light transmission member 150 of the see-through projection device 170 correspond to the first optical portion 103*a* in FIG. 1. The projection lens 130 of the see-through projection device 170 and the electro-optical device 10 correspond to the first built-in device unit 105*a* in FIG. 1.

The prism 110 of the see-through projection device 170 is an arc-shaped member curved along the face in a plan view and may be considered to be separated into a first prism portion 111 on a central side close to the nose and a second prism portion 112 on a peripheral side away from the nose. The first prism portion 111 is disposed on a light emission side and includes a first surface S11 (see FIG. 3), a second surface S12, and a third surface S13 as side surfaces having an optical function.

The second prism portion 112 is disposed on a light incident side and includes a fourth surface S14 (see FIG. 3) and a fifth surface S15 as side surfaces having an optical function. Of these surfaces, the first surface S11 is adjacent to the fourth surface S14, the third surface S13 is adjacent to the fifth surface S15, and the second surface S12 is disposed between the first surface S11 and the third surface S13. Further, the prism 110 includes the upper surface 110*e* adjacent to the first surface S11 and the fourth surface S14.

The prism 110 is made of a resin material having high transmissivity in a visible range and is molded by, for example, pouring a thermoplastic resin in a mold, and solidifying the thermoplastic resin. While a main portion 110*s* (see FIG. 3) of the prism 110 is illustrated as an integrally formed member, it can be considered to be separated into the first prism portion 111 and the second prism portion 112. The first prism portion 111 can guide and emit the image light GL while also allowing for see-through of the extraneous light. The second prism portion 112 can receive and guide the image light GL.

The light transmission member 150 is fixed integrally with the prism 110. The light transmission member 150 is a member that assists a see-through function of the prism 110, and is also referred to as an auxiliary prism. The light transmission member 150 has high transmissivity in a visible range and is made of a resin material having substantially the same refractive index as the refractive index of the main portion 110*s* of the prism 110. The light transmission member 150 is formed by, for example, molding a thermoplastic resin.

As illustrated in FIG. 3, the projection lens 130 includes, for example, three lenses 131, 132, and 133 along an incident side-optical axis. Each of the lenses 131, 132, and 133 is rotationally symmetric about a central axis of a light incident surface of the lens. At least one or more of the lenses 131, 132, and 133 is an aspheric lens.

The projection lens 130 allows the image light GL emitted from the electro-optical device 10 to enter the prism 110 and refocus the image on an eye EY. In other words, the projection lens 130 is a relay optical system for refocusing the image light GL emitted from each pixel of the electro-optical device 10 on the eye EY via the prism 110. The projection lens 130 is held inside the lens tube 162. The electro-optical device 10 is fixed to one end of the lens tube 162. The second prism portion 112 of the prism 110 is connected to the lens tube 162 holding the projection lens 130 and indirectly supports the projection lens 130 and the electro-optical device 10.

An electronic apparatus that is mounted on a user's head and covers the front of eyes, such as the head-mounted display 100, needs to be small and light. Furthermore, the electro-optical device 10 used in an electronic apparatus such as the head-mounted display 100 needs to achieve higher resolution, pixel miniaturization, multi-gray-scale display, and lower power consumption.

Configuration of Electro-Optical Device

Figure 4:
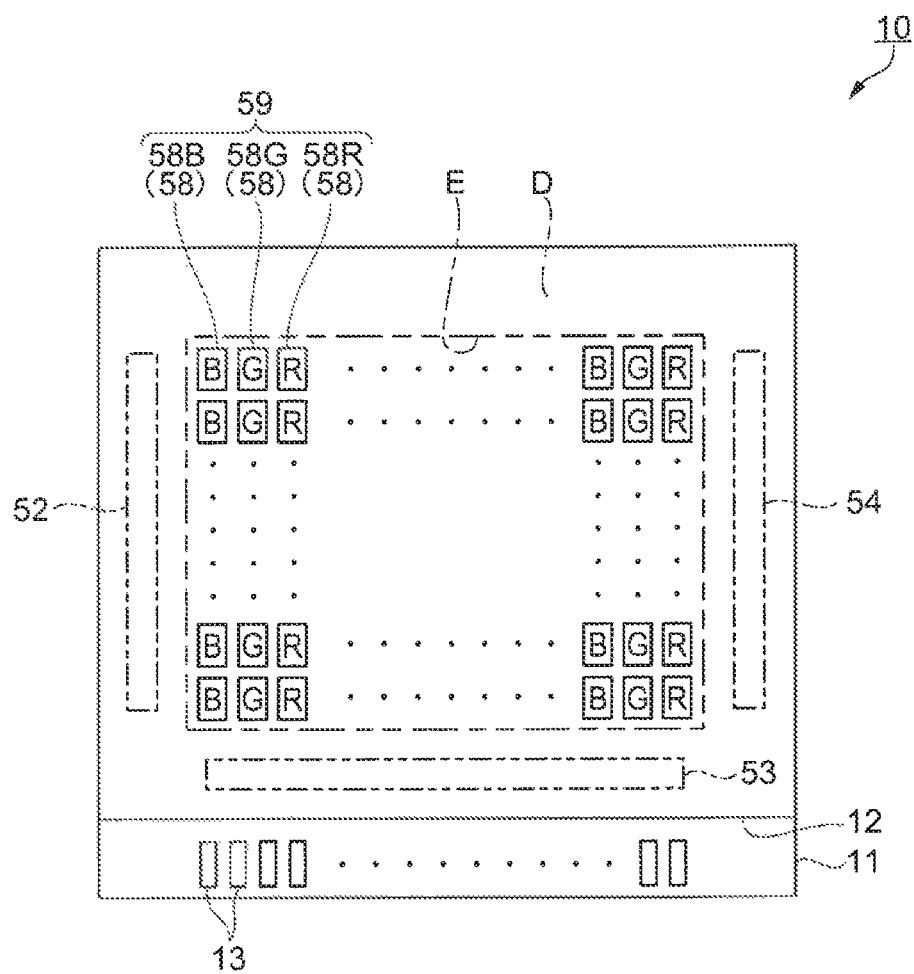
FIG. 4 is a schematic plan view illustrating a configuration of an electro-optical device according to the present exemplary embodiment.

Next, a configuration of an electro-optical device will be described with reference to FIG. 4. FIG. 4 is a schematic plan view illustrating the configuration of the electro-optical device according to the present exemplary embodiment. The present exemplary embodiment will be described by taking, as an example, a case where the electro-optical device 10 is an organic EL device including an organic EL element as a light-emitting element. As illustrated in FIG. 4, the electro-optical device 10 according to the present exemplary embodiment includes an element substrate 11 and a protective substrate 12. The element substrate 11 is provided with a color filter, which is not illustrated. The element substrate 11 and the protective substrate 12 are disposed to face each other and bonded together with a filling agent, which is not illustrated.

The element substrate 11 is formed of, for example, a single crystal semiconductor substrate such as a single crystal silicon wafer. The element substrate 11 includes a display region E and a non-display region D surrounding the display region E. In the display region E, for example, a sub-pixel 58B that emits blue (B) light, a sub-pixel 58G that emits green (G) light, and a sub-pixel 58R that emits red (R) light are arranged in, for example, a matrix. Each of the sub-pixel 58B, the sub-pixel 58G, and the sub-pixel 58R is provided with a light emitting element 20 (see FIG. 6). In the electro-optical device 10, a pixel 59 including the sub-pixel 58B, the sub-pixel 58G, and the sub-pixel 58R serves as a display unit to provide a full color display.

In this specification, the sub-pixel 58B, the sub-pixel 58G, and the sub-pixel 58R may not be distinguished from one another and may be collectively referred to as a sub-pixel 58. The display region E is a region through which light emitted from the sub-pixel 58 passes and that contributes to display. The non-display region D is a region through which light emitted from the sub-pixel 58 does not pass and that does not contribute to display.

The element substrate 11 is larger than the protective substrate 12 and a plurality of external coupling terminals 13 are aligned along a first side of the element substrate 11 extending from the protective substrate 12. A data line drive circuit 53 is provided between the plurality of external coupling terminals 13 and the display region E. A scan line drive circuit 52 is provided between another second side orthogonal to the first side and the display region E. An enable line drive circuit 54 is provided between a third side that is orthogonal to the first side and opposite from the second side and the display region E.

The protective substrate 12 is smaller than the element substrate 11 and is disposed so as to expose the external coupling terminals 13. The protective substrate 12 is a light transmitting substrate, and, for example, a quartz substrate, a glass substrate, and the like may be used as the protective substrate 12. The protective substrate 12 serves to protect the light emitting element 20 disposed in the sub-pixel 58 in the display region E from damage and is disposed to face at least the display region E.

Note that, a color filter may be provided on the light emitting element 20 in the element substrate 11 or provided on the protective substrate 12. When beams of light corresponding to colors are emitted from the light emitting element 20, a color filter is not essential. The protective substrate 12 is also not essential, and a protective layer that protects the light emitting element 20 may be provided instead of the protective substrate 12 on the element substrate 11.

In this specification, a direction along the first side on which the external coupling terminals 13 are arranged is referred to as an X direction or a row direction, and a direction along the second side and the third side, which are the other two sides perpendicular to the first side and opposite to each other, is referred to as a Y direction or a column direction. For example, the present exemplary embodiment adopts a so-called stripe arrangement in which the sub-pixels 58 that emit the same color are arranged in the Y direction, which is the column direction, and the sub-pixels 58 that emit different colors are arranged in the X direction, which is the row direction.

Note that, the arrangement of the sub-pixels 58 in the X direction, which is the row direction, may not be limited to the order of B, G, and R as illustrated in FIG. 4 but may be in other order, for example, R, G, and B. The arrangement of the sub-pixels 58 is not limited to the stripe arrangement but may be a delta arrangement, a Bayer arrangement or an S-stripe arrangement. In addition, the sub-pixels 58B, the sub-pixels 58G and the sub-pixels 58R are not limited to the same shape or size.

First Exemplary Embodiment

Configuration of Circuit of Electro-Optical Device

Figure 5:
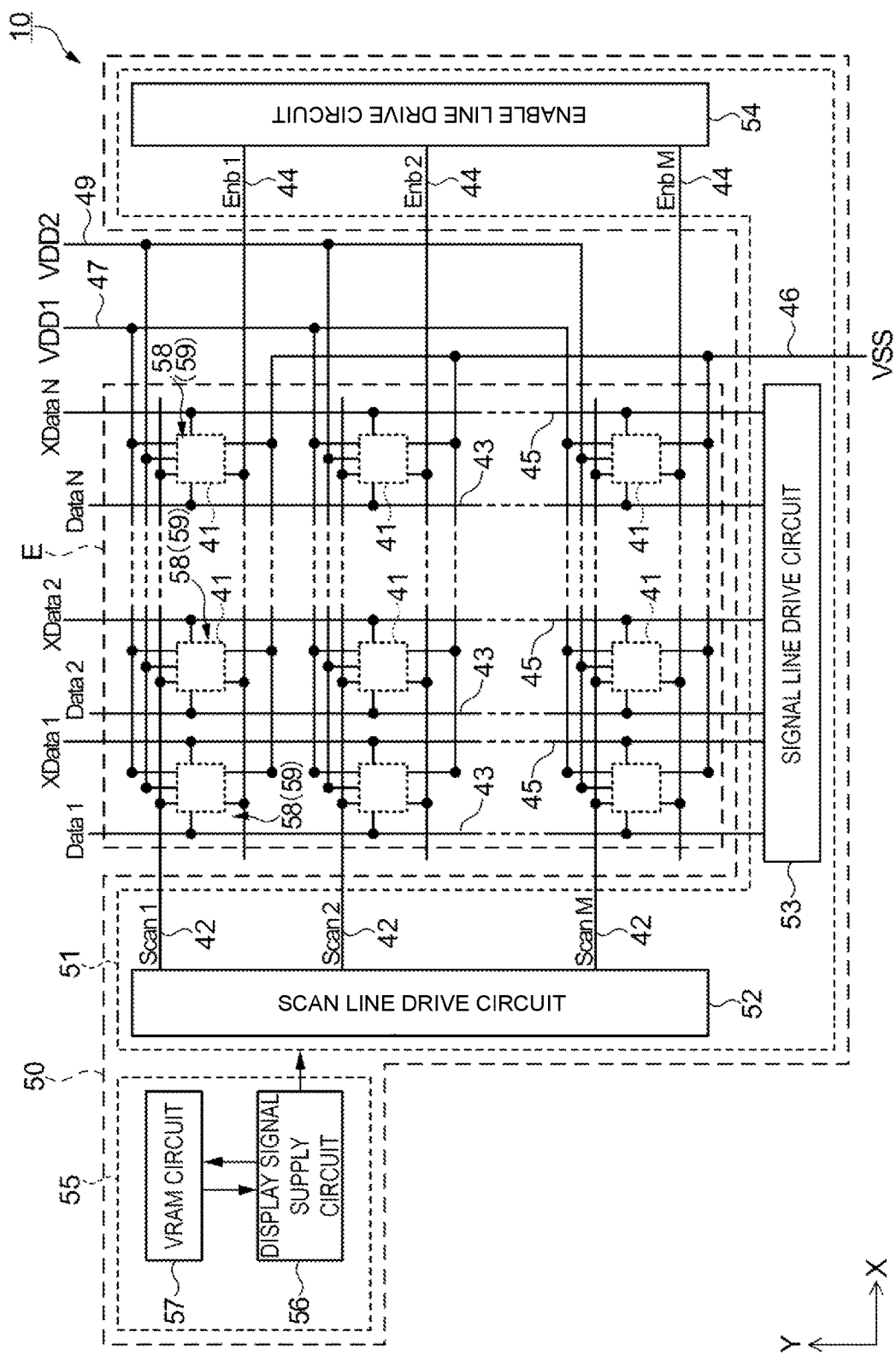
FIG. 5 is a block diagram of a circuit of the electro-optical device according to the present exemplary embodiment.

Next, a configuration of the circuit of the electro-optical device will be described with reference to FIG. 5. FIG. 5 is a block diagram of the circuit of the electro-optical device according to the present exemplary embodiment. As illustrated in FIG. 5, formed in the display region E of the electro-optic device 10 are a plurality of scan lines 42 and a plurality of data lines 43 that cross each other with the sub-pixels 58 being arranged in a matrix to correspond to the respective intersections of the scan lines 42 and the data lines 43. Each of the sub-pixels 58 includes a pixel circuit 41 including the light emitting element 20 (see FIG. 8), and the like.

An enable line 44 is formed for each of the corresponding scan lines 42 in the display region E of the electro-optical device 10. The scan line 42 and the enable line 44 extend in the row direction. Further, a complementary data line 45 is formed for each of the corresponding data lines 43 in the display region E. The data line 43 and the complementary data line 45 extend in the column direction.

In the electro-optical device 10, the sub-pixels 58 in M rows×N columns are disposed in matrix in the display region E. Specifically, M scan lines 42, M enable lines 44, N data lines 43, and N complementary data lines 45 are formed in the display region E. Note that, M and N are integers of two or greater, and M=720 and N=1280×p is one example in the present exemplary embodiment. p is an integer of one or greater and indicates the number of basic display colors. The present exemplary embodiment is described by taking, as an example, a case where p=3, that is, the basic display colors are three colors of R, G, and B.

The electro-optical device 10 includes a drive unit 50 outside the display region E. The driving unit 50 supplies various signals to the respective pixel circuits 41 arranged in the display region E. An image is displayed in the display region. E such that a unit of display is the pixel 59 including three sub-pixels 58 for the respective colors. The drive unit 50 includes a drive circuit 51 and a control unit 55. The control unit 55 supplies a display signal to the drive circuit 51. The drive circuit 51 supplies a drive signal to each of the pixel circuits 41 through the plurality of scan lines 42, the plurality of data lines 43, and the plurality of enable lines 44, based on the display signal.

Moreover, the following potential lines are disposed in the non-display region D and the display region E: a high potential line 47 serving as a first potential line supplied with a first potential, a low potential line 46 serving as a second potential line supplied with a second potential, and a high potential line 49 serving as a third potential line supplied with a third potential. To each of the pixel circuits 41, the high potential line 47 supplies the first potential, the low potential line 46 supplies the second potential, and the high potential line 49 supplies the third potential.

In First Exemplary Embodiment, the first potential (V1) is a first high potential VDD1 (e.g., V1=VDD1=3.0 V), the second potential (V2) is a low potential VSS (e.g., V2=VSS=0 V), and the third potential (V3) is a second high potential VDD2 (e.g., V3=VDD2=7.0 V). Therefore, the first potential is higher than the second potential, and the third potential is higher than the first potential. In other words, an absolute value of a potential difference of the first potential (V1) with respect to the second potential (V2) is a smaller than an absolute value of a potential difference of the third potential (V3) with respect to the second potential (V2).

In the present exemplary embodiment, the first potential (first high potential VDD1) and the second potential (low potential VSS) constitute a low-voltage power-supply, whereas the third potential (second high potential VDD2) and the second potential (low potential VSS) constitute a high-voltage power-supply. The second potential is a potential serving as a reference for the low-voltage power-supply and the high-voltage power-supply.

Note that, in one example of the present exemplary embodiment, the second potential line (low potential line 46), the first potential line (high potential line 47), and the third potential line (high potential line 49) extend in the row direction within the display region E but these lines may extend in the column direction, or some of the lines may extend in the row direction with the others extending in the column direction, or the lines may be disposed in a grid pattern in both the row and column directions.

The drive circuit 51 includes the scan line drive circuit 52, the data line drive circuit 53, and the enable line drive circuit 54. The drive circuit 51 is provided in the non-display; region D (see FIG. 4). In the present exemplary embodiment, the drive circuit 51 and the pixel circuit 41 are formed on the element substrate 11 illustrated in FIG. 4. In the present exemplary embodiment, the element substrate 11 is a single crystal silicon wafer. Specifically, the drive circuit 51 and the pixel circuit 41 are each formed of an element such as a transistor formed on the single crystal silicon wafer.

The scan lines 42 are electrically connected to the scan line drive circuit 52. The scan line drive circuit 52 outputs a scan signal (Scan) that allows the pixel circuits 41 to be selected or unselected in the row direction to respective scan lines 42. The scan lines 42 transmit the scan signals to the pixel circuits 41. In other words, the scan signal has a selection state and a non-selection state, and the scan lines 42 are appropriately selected in response to the scan signals received from the scan line drive circuits 52. The scan signal has a potential between the second potential (low potential VSS) and the third potential (second high potential VDD2).

Since in the present embodiment, the fifth transistor 35, which is a selecting transistor, and the sixth transistor 36, which is a complementary selecting transistor, are both N-type (see FIG. 8), as will be described later, the scan signal in the selection state, namely a selection signal, is an high potential (High), whereas, the scan signal in the non-selection state, namely a non-selection signal, is a low potential (Low). A fourth potential (V4) that is the potential of the selection signal is set to a high potential higher than or equal to the first potential (V1) and is preferably equal to the third potential (V3). Furthermore, a fifth potential (V5) that is the potential of the non-selection signal is set to a low potential lower than or equal to the second potential (V2) and is preferably equal to the second potential (V2). An absolute value of a potential difference of the fourth potential (V4) with respect to the second potential (V2) is larger than the absolute value of the potential difference of the first potential (V1) with respect to the second potential (V2).

Note that, to specify a scan signal supplied to a scan line 42 in an i-th row out of the M scan lines 42, the scan signal is named as a scan signal Scan i. The scan line drive circuit 52 includes a shift register circuit, which is not illustrated, and a signal for shifting the shift register circuit is output as a shift output signal for each stage. The shift output signals are then used to generate scan signals from Scan 1 in a first row to Scan M in an M-th row.

The data lines 43 and the complementary data lines 45 are electrically connected to the data line drive circuit 53. The data line drive circuit 53 includes a shift register circuit, a decoder circuit, or a demultiplexer circuit, which is not illustrated. The data line drive circuit 53 supplies an image signal (Data) to each of the N data lines 43 and a complementary image signal (XData) to each of the N complementary data lines 45 in synchronization with the selection of the scan line 42. The image signal and the complementary image signal are each a digital signal having the first potential (VDD1 in the present exemplary embodiment) or the second potential (VSS in the present exemplary embodiment).

Note that, to specify an image signal supplied to a data line 43 in a j-th column out of the N data lines 43, the image signal is named as an image signal Data j. Similarly, to specify a complementary image signal supplied to a complementary data line 45 in the j-th column out of the N complementary data lines 45, the complementary image signal is designated as a complementary image signal XData j.

The enable lines 44 are electrically connected to the enable line drive circuit 54. The enable line drive circuit 54 outputs a control signal unique to a row to each of the enable lines 44 divided into each row. The enable line 44 supplies this control signal to the pixel circuit 41 in the corresponding row. The control signal has an active state and an inactive state, and the enable line 44 may be appropriately brought into the active state in response to the control signal received from the enable line drive circuit 54. The control signal has a potential between the second potential (low potential VSS) and the third potential (second high potential VDD2).

Since in the present exemplary embodiment a seventh transistor 37 is P-type (see FIG. 8) as will be described later, the control signal in the active state (active signal) is Low (low potential), whereas the control signal in the inactive state (inactive signal) is High (high potential). A sixth potential (V6) that is the potential of the active signal is set lower than or equal to V3−(V1−V2) and is preferably equal to the second potential (V2). Furthermore, a seventh potential (V7) that is the potential of the inactive signal is set higher than or equal to the third potential (V3) and is preferably equal to the third potential (V3).

Note that, to specify a control signal supplied to an enable line 44 in the i-th row out of the M enable lines 44, the control signal is named as a control signal Enb i. The enable line drive circuit 54 may supply the active signal or the inactive signal as a control signal to each row, or may supply the active signal or the inactive signal as a control signal simultaneously to a plurality of rows. In the present exemplary embodiment, the enable line drive circuit 54 supplies the active signal or the inactive signal simultaneously to all of the pixel circuits 41 located in the display region E through the enable lines 44.

The control unit 55 includes a display signal supply circuit 56 and a Video Random Access Memory (VRAM) circuit 57. The VRAM circuit 57 temporarily stores a frame image and the like. The display signal supply circuit 56 generates a display signal, such as an image signal and a clock signal, from a frame image temporarily stored in the VRAM circuit 57 and supplies the display signal to the drive circuit 51.

In the present exemplary embodiment, the drive circuit 51 and the pixel circuits 41 are formed on the element substrate 11. In the present exemplary embodiment, the element substrate 11 is a single crystal silicon wafer. Specifically, the drive circuit 51 and the pixel circuits 41 are each formed of a transistor element formed on the single crystal silicon wafer.

The control unit 55 is formed of a semiconductor integrated circuit formed on a substrate (not illustrated) formed of a single crystal semiconductor substrate different from the element substrate 11. The substrate on which the control unit 55 is formed is connected to the external coupling terminals 13 provided on the element substrate 11 with a flexible Printed Circuit (FPC). A display signal is supplied from the control unit 55 to the drive circuit 51 through this flexible printed circuit.

Configuration of Pixel

Figure 6:
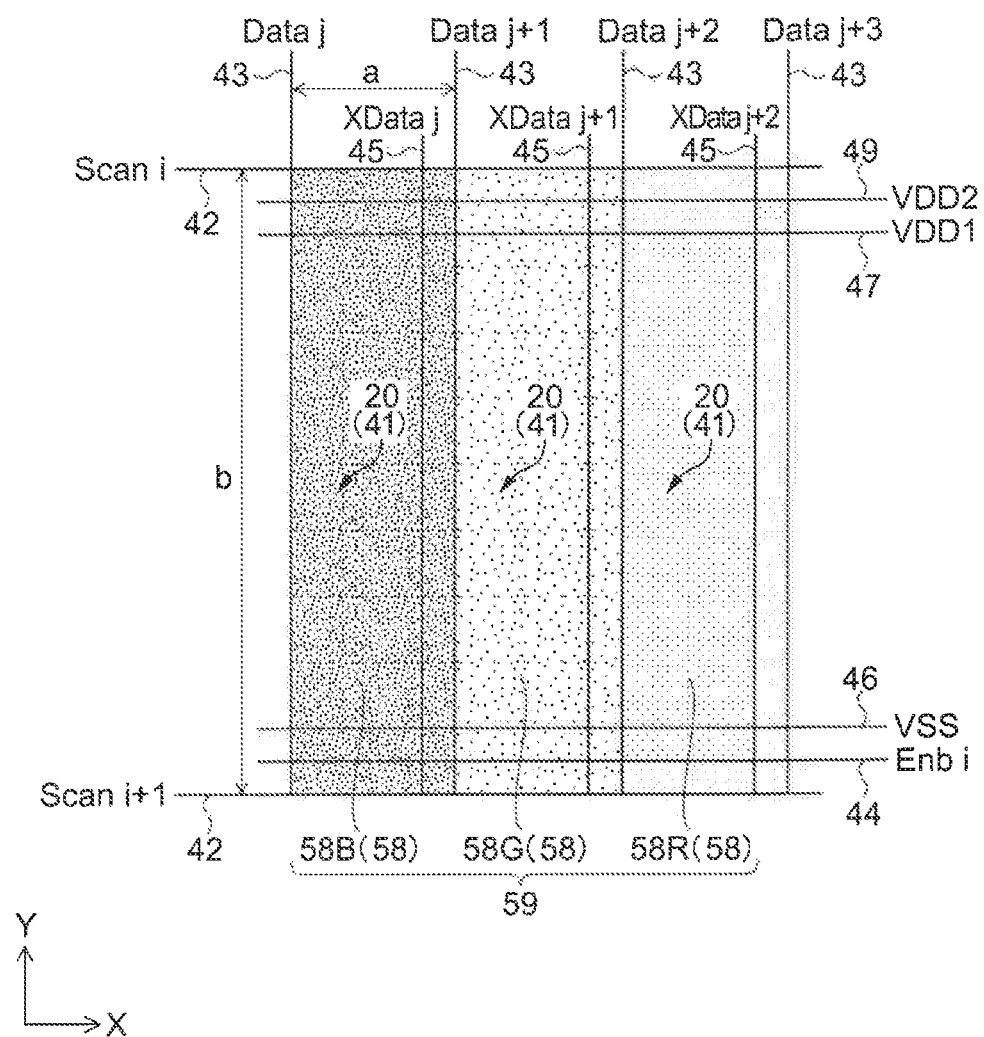
FIG. 6 is a diagram illustrating a configuration of a pixel according to the present exemplary embodiment.

Next, a configuration of a pixel according to the present exemplary embodiment will be described with reference to FIG. 6. FIG. 6 is a diagram illustrating the configuration of the pixel according to the present exemplary embodiment.

As described above, in the electro-optic device 10, the pixel 59 including the sub-pixels 58 forms a unit of display to display an image. In the present exemplary embodiment, the length a of each sub-pixel 58 in the X direction, which is the row direction, is 4 micrometers (μm) and the length b of each sub-pixel 58 in the Y direction, which is the column direction, is 12 micrometers (μm). In other words, the pitch at which the sub-pixels 58 are disposed in the X direction, i.e. the row direction, is 4 micrometers (μm) and the pitch at which the sub-pixels 58 are disposed in the Y direction, i.e. the column direction, is 12 micrometers (μm).

Each of the sub-pixels 58 includes the pixel circuit 41 including the Light-emitting element (LED) 20. The light emitting element 20 emits white light. The electro-optical device 10 includes a color filter (not illustrated) through which light emitted from the light emitting element 20 passes. The color filter includes color filters in colors corresponding to basic display colors p. In the present exemplary embodiment, the basic colors p=3, and color filters in respective colors of B, G, and R are disposed in the corresponding sub-pixels 58B, 58G, and 58R.

In the present exemplary embodiment, an organic Electro Luminescence (EL) element is used as one example of the light emitting element 20. The organic EL element may have an optical resonant structure that amplifies the intensity of light having a specific wavelength. Specifically, the organic EL element may be configured such that a blue component is extracted from the white light emitted from the light emitting element 20 in the sub-pixel 58B; a green light is extracted from the white light emitted from the light emitting element 20 in the sub-pixel 58G; and a red light is extracted from the white light emitted from the light emitting element 20 in the sub-pixel 58R.

In addition to the above-described example, assuming that basic color p=4, a sub-pixel 58 substantially without a color filter for a color other than B, G, and R, for example, a color filter for white light may be prepared, or a sub-pixel 58 including a color filter for light in another color such as yellow and cyan may be prepared. Furthermore, a light emitting diode element such as gallium nitride (GaN), a semiconductor laser element, and the like may be used as the light emitting element 20.

Digital Driving of Electro-Optical Device

Figure 7:
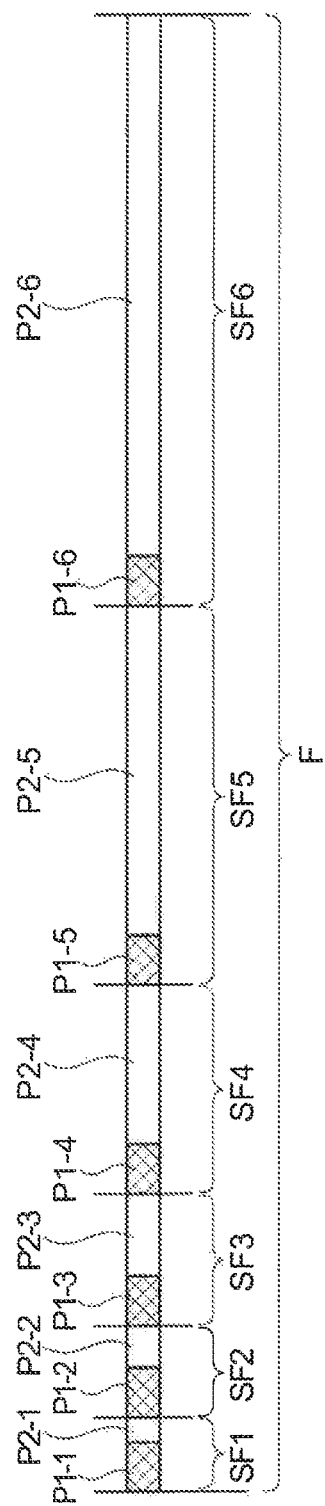
FIG. 7 is a diagram illustrating digital driving of the electro-optical device according to the present exemplary embodiment.

Next, a method for displaying an image by digital driving in the electro-optical device 10 according to the present exemplary embodiment will be described with reference to FIG. 7. FIG. 7 is a diagram illustrating the digital driving of the electro-optical device according to the present exemplary embodiment.

The electro-optical device 10 displays a predetermined image in the display region E (see FIG. 4) by digital driving. That is, the light emitting element 20 (see FIG. 6) disposed in each of the sub-pixels 58 is placed in either of binary states: emission, i.e. bright state, or non-emission, i.e. dark state. The gray-scale of a displayed image is determined by the ratio of the light emitting period for each of the light emitting elements 20. This is referred to as time division driving.

As illustrated in FIG. 7, in the time division driving, one field (F) displaying one image is divided into a plurality of subfields (SFs) and the gray-scale display is expressed by controlling emission and non-emission of the light emitting element 20 for each of the subfields (SFs). An example in which a display with $2^6$=64 gray-scales is performed by a 6-bit time division gray-scale scheme will be described as one example here. In the 6-bit time division gray-scale scheme, one field F is divided into six subfields SF1 to SF6.

In FIG. 7, an i-th subfield in the one field F is designated as SFi and the six subfields from the first subfield SF1 to the sixth subfield SF6 are illustrated. Each of the subfields SF includes a display period P2 as a second period, i.e. P2-1 to P2-6, and optionally a non-display period as a first period, i.e. P1-1 to P1-6. The non-display period can correspond to a signal-writing period.

Note that, the subfields SF1 to SF6 may not be distinguished from one another and may be collectively referred to as a subfield SF, the non-display periods P1-1 to P1-6 may not be distinguished from one another and may be collectively referred to as a non-display period P1, and the display periods P2-1 to P2-6 may not be distinguished from one another and may be collectively referred to as a display period P2 in this specification.

The light emitting element 20 is placed either in the emission or non-emission state during the display period P2 while the light emitting element 20 is placed in the non-emission state during the non-display period P1, which is the signal-writing period. The non-display period P1 is used, for example, to write an image signal to a memory circuit 60 (see FIG. 8) and adjust display time. If the shortest subfield such as SF1 is relatively long, the non-display period P1 may be omitted.

In the 6-bit time division gray-scale scheme, the display period P2 (P2-1 to P2-6) of each of the subfields SFs is set such that (P2-1 of SF1):(P2-2 of SF2):(P2-3 of SF3):(P2-4 of SF4):(P2-5 of SF5):(P2-6 of SF6)=1:2:4:8:16:32. For example, if an image is displayed by a progressive scheme having a frame frequency of 30 Hz, then, one frame=one field (F)=33.3 milliseconds (msec).

In the above-described example, assuming that the non-display period P1 (P1-1 to P1-6) of each of the subfields SF is one second, the display periods P2 are set such that (P2-1 of SF1)=0.434 milliseconds, (P2-2 of SF2)=0.868 milliseconds, (P2-3 of SF3)=1.735 milliseconds, (P2-4 of SF4)=3.471 milliseconds, (P2-5 of SF5)=6.942 milliseconds, and (P2-6 of SF6)=13.884 milliseconds.

Here, the duration of the non-display period P1 is represented by x (sec), and the duration of the shortest display period P2 is represented by y (sec). In the above-described example, the shortest display period P2 is the display period P2-1 in the first subfield SF1. Furthermore, given that the number of gray-scale bits corresponding to the number of subfields SF (=the number of subfields SF) is g, and the field frequency is f (Hz), then the relationship among f, g, x, and y is expressed by Expression 2 below:

[Expression 2]

$$gx+(2^g-1)y=1/f \quad (2)$$

In the digital driving of the electro-optical device 10, a gray-scale image is displayed based on the ratio of the emission period to the total display period P2 within one field F. For example, for black display with a gray-scale of "0", the light emitting element 20 is placed into non-emission in all of the display periods P2-1 to P2-6 of the six subfields SF1 to SF6. On the other hand, for white display with a gray-scale of "63", the light emitting element 20 is placed into emission during all of the display periods P2-1 to P2-6 of the six subfields SF1 to SF6.

To obtain a display of intermediate luminance with a gray-scale of, for example, "7" out of 64 gray-scales, the light emitting element 20 is caused to emit light during the display periods P2-1, P2-2, and P2-3 of the first, second and third subfields SF1, SF2, and SF3, respectively, and the light emitting element 20 is placed into non-emission during the display periods P2-4 to P2-6 of the other subfields SF4 to SF6. In this way, a display of intermediate gray-scale can be achieved by appropriately selecting emission or no-emission of the light emitting element 20 during the display period P2 for each of the subfields SF constituting the one field F.

In an organic EL device serving as a typical analog driven electro-optical device in prior art, gray-scale display is performed by analog control of a current flowing through an organic EL element according to the gate potential of a driving transistor, such that any variation in voltage-current characteristics and threshold voltage of the driving transistor may cause variations in brightness and shifts in gray-scale between pixels, resulting in a decreased display quality. On the other hand, when a compensating circuit that compensates for variations in voltage-current characteristics and threshold voltage of a driving transistor is provided as described in JP-A-2002-287695, a current also flows through the compensating circuit, causing an increase in power consumption.

Furthermore, in a typical organic EL device in prior art, the electric capacitance of a capacitive element for storing an image signal as an analog signal needs to be increased in order to achieve multi-gray-scale display. This requirement is a trade-off with higher resolution and pixel miniaturization and also leads to increased power consumption due to the charging and discharging of a capacitive element with a large capacity. In other words, in a typical organic EL device, an electro-optical device capable of displaying a high-resolution, multi-gray-scale, and high-quality image at low power consumption is difficult to achieve.

In the electro-optical device 10 according to the present exemplary embodiment, the light emitting element 20 is operated based on binary states of ON and OFF, so that the light emitting element 20 is placed into either of binary states of emission or non-emission. Thus, the electro-optical device 10 is less affected by variations in voltage-current characteristics or threshold voltage of a transistor than electro-optical device 10 operated by analog driving, so that a high-quality displayed image with less variations in brightness and less shifts in gray-scale among the pixels 59, i.e., the sub-pixels 58 can be obtained. Furthermore, since a capacitive element in digital driving does not need to have a large capacitance as required in analog driving, not only the pixel 59, i.e., the sub-pixels 58 can be miniaturized, but the resolution can also be easily improved and the power consumption due to charging and discharging of a large capacitive element can be reduced.

Furthermore, the number of gray-scales can be easily increased by increasing the number g of the subfields SF constituting the one field F in digital driving of the electro-optical device 10. In this case, with the non-display period P1 as described above, the number of gray-scales can be increased by simply shortening the shortest display period P2. For example, when display is performed with 256 gray-scales assuming that g=8 in the progressive scheme at the frame frequency f=30 Hz, the duration y of the shortest display period P2-1 of SF1 may be simply set to 0.100 millisecond by Expression 2 assuming that duration x of the non-display period P1=one millisecond.

As described later, in digital driving of the electro-optical device 10, the non-display period P1 as the first period may be assigned to a signal-writing period during which an image signal is written into the memory circuit 60 or a signal-rewriting period during which an image signal is rewritten. Thus, 6-bit gray-scale display can be easily switched to 8-bit gray-scale display without changing the signal-writing period. In other words, 6-bit gray-scale display can be easily switched to 8-bit gray-scale display without changing the clock frequency of the drive circuit 51.

Furthermore, in digital driving of the electro-optical device 10, an image signal in the memory circuit 60 (see FIG. 8) of the sub-pixel 58 for which display is to be changed is rewritten among the subfields SF or among the fields F. On the other hand, an image signal in the memory circuit 60 of the sub-pixel 58 for which display is not to be changed is not rewritten, in other words, the image signal is maintained. As a result, the power consumption can be reduced. That is, this configuration can provide the electro-optical device 10 capable of, e.g., reducing energy consumption, reducing variations in brightness and shifts in grayscale among the pixels 59, i.e., the sub-pixels 58, achieving multi-gray-scale display, and displaying high-resolution images.

Configuration of Pixel Circuit

Figure 8:
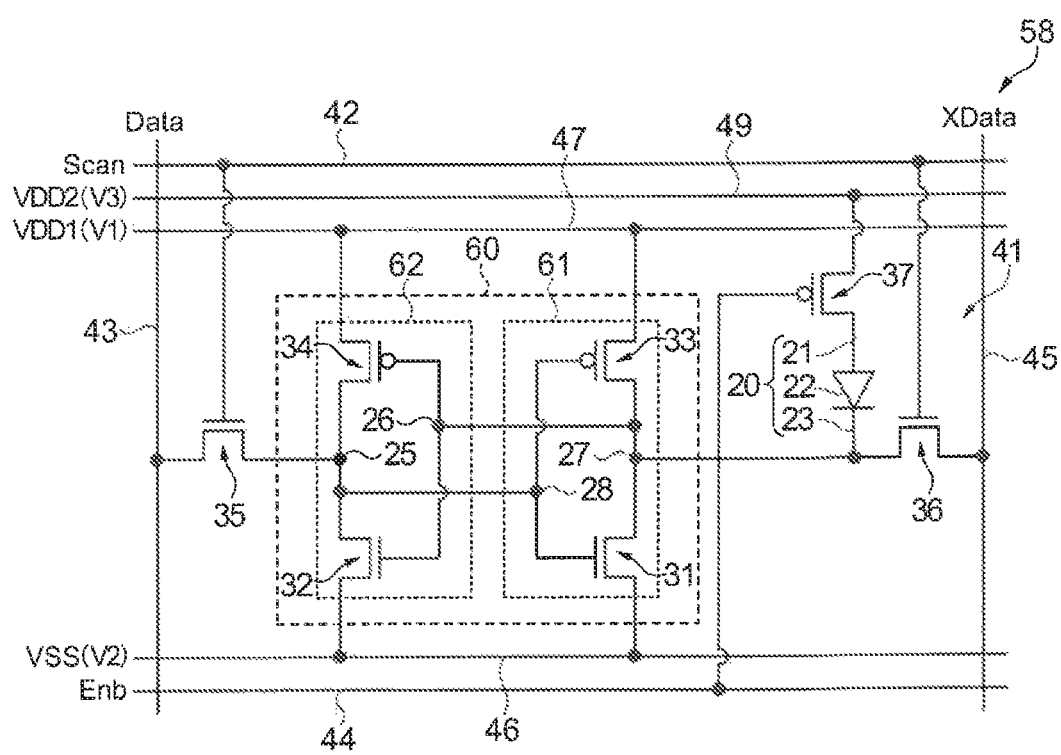
FIG. 8 is a diagram illustrating a configuration of a pixel circuit according to First Exemplary Embodiment.

Now, a configuration of the pixel circuit according to First Exemplary Embodiment will be described with reference to FIG. 8. FIG. 8 is a diagram illustrating the configuration of the pixel circuit according to First Exemplary Embodiment.

As illustrated in FIG. 8, a pixel circuit 41 is provided for each of sub-pixels 58 disposed at intersections of scan lines 42 and data lines 43. An enable line 44 is disposed along the scan line 42 and a complementary data line 45 is disposed along the data line 43. The scan line 42, the data line 43, the enable line 44, and the complementary data line 45 correspond to each of the pixel circuits 41.

In First Exemplary Embodiment, for each of the pixel circuits 41, the first potential (first high potential VDD1) is supplied from the high potential line 47, the second potential (low potential VSS) is supplied from the low potential line 46, and the third potential (second high potential VDD2) is supplied from the high potential line 49.

The pixel circuit 41 according to First Exemplary Embodiment includes the light emitting element 20, the P-type seventh transistor 37, the memory circuit 60, the N-type fifth transistor 35, and the N-type sixth transistor 36. The memory circuit 60 incorporated in the pixel circuit 41 enables digital driving of the electro-optical device 10 and helps reduce the variation in the luminance of the light emitting element 20 among the sub-pixels 58 as compared to analog driving and thus, the variation in display among the pixels 59.

The light emitting element 20 and the seventh transistor 37 are disposed in series between the third potential line (high potential line 49) and the memory circuit 60. The memory circuit 60 is disposed between the first potential line (high potential line 47) and the second potential line (low potential line 46). The fifth transistor 35 is disposed between the memory circuit 60 and the data line 43. The sixth transistor 36 is disposed between the memory circuit 60 and the complementary data line 45.

The memory circuit 60 includes a first inverter 61 and a second inverter 62. The memory circuit 60 includes the two inverters 61 and 62 that are connected to each other in circle to constitute a so-called static memory that stores a digital signal that is an image signal. An output terminal 27 of the first inverter 61 is electrically connected to an input terminal 26 of the second inverter 62, and an output terminal 25 of the second inverter 62 is electrically connected to an input terminal 28 of the first inverter 61.

In this specification, the state where an output or input terminal A and an output or input terminal B are electrically connected to each other means a state where the logic of the terminal A and the logic of the terminal B may be equal. For example, even when a transistor, a resistive element, a diode, and the like are disposed between the terminal A and the terminal B, the terminals will be regarded as a state of electrically connected if these logics are the same. Further, "dispose" as used in the expression "a transistor and other elements are disposed between A and B" does not mean how these elements are arranged on an actual lay-out, but meats how these elements are arranged in a circuit diagram.

A digital signal stored in the memory circuit 60 has a binary value of High or Low. In the present exemplary embodiment, when the output terminal 27 of the first inverter 61 is Low, i.e., when the output terminal 25 of the second inverter 62 is High, the light emitting element 20 is allowed to emit light, whereas when the output terminal 27 of the first inverter 61 is High, i.e., when the output terminal 25 of the second inverter 62 is Low, the light emitting element 20 is prevented from emitting light.

In the present exemplary embodiment, the two inverters 61 and 62 constituting the memory circuit 60 are disposed between the first potential line (high potential line 47) and the second potential line (low potential line 46), and VDD1 as the first potential (V1) and VSS as the second potential (V2) are supplied to the two inverters 61 and 62. Therefore, High corresponds to the first potential (VDD1), whereas Low corresponds to the second potential (VSS).

When a digital signal is stored in the memory circuit 60 and a potential of the output terminal 27 of the first inverter 61 becomes Low, Low is input to the input terminal 26 of the second inverter 62 and a potential of the output terminal 25 of the second inverter 62 becomes High. Then, High is input to the input terminal 28 of the first inverter 61 and the potential of the output terminal 27 of the first inverter 61 becomes Low. In such a manner, the digital signal stored in the memory circuit 60 is maintained in the stable state until the digital signal is rewritten next.

The first inverter 61 includes the first transistor 31 of the N-type as a first conductivity type and the third transistor 33 of the P-type as a second conductivity type, and has a CMOS configuration. The first transistor 31 and the third transistor 33 are disposed in series between the first potential line (high potential line 47) and the second potential line (low potential line 46). A source of the first transistor 31 is electrically connected to the second potential line (low potential line 46). A source of the third transistor 33 is electrically connected to the first potential line (high potential line 47).

The second inverter 62 includes the second transistor 32 of the N-type as the first conductivity type and the fourth transistor 34 of the P-type as the second conductivity type, and has a CMOS configuration. The second transistor 32 and the fourth transistor 34 are disposed in series between the first potential line (high potential line 47) and the second potential line (low potential line 46). A source of the second transistor 32 is electrically connected to the second potential line (low potential line 46). A source of the fourth transistor 34 is electrically connected to the first potential line (high potential line 47).

The output terminal 27 of the first inverter 61 is a drain of the first transistor 31 and the third transistor 33. The output terminal 25 of the second inverter 62 is a drain of the second transistor 32 and the fourth transistor 34. The input terminal 28 of the first inverter 61 is a gate of the first transistor 31 and the third transistor 33, and is electrically connected to the output terminal 25 of the second inverter 62. Similarly, the input terminal 26 of the second inverter 62 is a gate of the second transistor 32 and the fourth transistor 34, and is electrically connected to the output terminal 27 of the first inverter 61.

Note that, it is assumed in the present exemplary embodiment that both of the first inverter 61 and the second inverter 62 have the CMOS configuration, but these inverters 61 and 62 may be formed of a transistor and a resistance element. For example, the third transistor 33 in the first inverter 61 may be replaced with a resistance element, or the fourth transistor 34 in the second inverter 62 may be replaced with a resistance element.

The light emitting element 20 is an organic EL element in the present exemplary embodiment, and includes an anode 21 serving as a pixel electrode, a light emitting section 22 serving as a light emission functional layer, and a cathode 23 serving as a counter electrode. The light emitting section 22 is configured to emit light by a part of energy being discharged as fluorescence or phosphorescence when an exciton is formed by a positive hole injected from the anode 21 side and an electron injected from the cathode 23 side and the exciton disappears, i.e., when the positive hole recombines with the electron.

In the pixel circuit 41 according to First Exemplary Embodiment, the light emitting element 20 is disposed between the seventh transistor 37 and the output terminal 27 of the first inverter 61 (the drain of the first transistor 31). The anode 21 of the light emitting element 20 is electrically connected to a drain of the seventh transistor 37. The cathode 23 of the light emitting element 20 is electrically connected to the drain of the first transistor 31.

The first transistor 31 is a transistor constituting the first inverter 61 and also serves as a driving transistor for the light emitting element 20. The drain of the first transistor 31 (the output terminal 27 of the first inverter 61) is electrically connected to the cathode 23 of the light emitting element 20.

The seventh transistor 37 is a control transistor that controls emission of the light emitting element 20. When the seventh transistor 37 is in an ON-state, the light emitting element 20 may emit light. As described later, in the present exemplary embodiment, the light emitting element 20 emits light when an active signal is supplied to the enable line 44 as a control signal, the seventh transistor 37 is then brought into the ON-state, the output terminal 27 of the first inverter 61 has a potential corresponding to emission, and the first transistor 31 is then brought into the ON-state.

A gate of the seventh transistor 37 is electrically connected to the enable line 44. A source of the seventh transistor 37 is electrically connected to the third potential line (high potential line 49). The drain of the seventh transistor 37 is electrically connected to the light emitting element 20 (anode 21). Therefore, the seventh transistor 37, the light emitting element 20, and the first transistor 31 are disposed in series between the third potential line (high potential line 49) and the second potential line (low potential line 46). The P-type seventh transistor 37 is disposed on a high potential side with respect to the light emitting element 20, and the N-type first transistor 31 is disposed on a low potential side with respect to the light emitting element 20.

Herein, a source potential is compared with a drain potential and the one having a lower potential is a source in the N-type transistor. A source potential is compared with a drain potential and the one having a higher potential is a source in the P-type transistor. The N-type transistor is disposed on the low potential side with respect to the light emitting element 20. On the other hand, the P-type transistor is disposed on the high potential side with respect to the light emitting element 20. This arrangement of the N-type transistor and P-type transistor with respect to the light emitting element 20 fixes the source of each transistor, thus facilitating substantially linear operation of each transistor. Substantially linear operation of the transistor is hereinafter simply referred to as linear operation of the transistor.

The first transistor 31 and the seventh transistor 37 are preferably of the different conductivity types. In the present exemplary embodiment, the first transistor 31 is of the N-type, and the seventh transistor 37 is of the P-type. The N-type first transistor 31 is disposed on the low potential side with respect to the light emitting element 20, and the P-type seventh transistor 37 is disposed on the high potential side with respect to the light emitting element 20. Therefore, the first transistor 31 and the seventh transistor 37 can be linearly operated, and variations in threshold voltages of the first transistor 31 and the seventh transistor 37 can be prevented from affecting luminance of the light emitting element 20.

The source of the first transistor 31 is electrically connected to the second potential line (low potential line 46), and the source of the seventh transistor 37 is electrically connected to the third potential line (high potential line 49). Thus, a source potential of the first transistor 31 is fixed to the second potential (V2), and a source potential of the seventh transistor 37 is fixed to the third potential (V3). Thus, even when the first transistor 31 and the seventh transistor 37 have a small source-drain voltage, electric conductivity of the first transistor 31 and the seventh transistor 37 in the ON-state can be increased. As a result, most of a potential difference between the third potential (V3=VDD2) and the second potential (V2=VSS) is applied to the light emitting element 20. Thus, the display characteristic is less likely to be affected by variations in the threshold voltages of the first transistor 31 and the seventh transistor 37, and uniformity of the luminance of the light emitting element 20 among the pixels 59, i.e. among the sub-pixels 58, is improved.

The fifth transistor 35 is disposed between the input terminal 28 of the first inverter 61 and the data line 43. One of a source and a drain of the N-type fifth transistor 35 is electrically connected to the data line 43, and the other is electrically connected to the input terminal 28 of the first inverter 61 and the output terminal 25 of the second inverter 62. That is, the other of the source and the drain of the N-type fifth transistor 35 is electrically connected to the gate of the first transistor 31 and the gate of the third transistor 33 and to the drain of the second transistor 32 and the drain of the fourth transistor 34. A gate of the fifth transistor 35 is electrically connected to the scan line 42.

The sixth transistor 36 is a complementary transistor of the fifth transistor 35, and is disposed between the input terminal 26 of the second inverter 62 in the memory circuit 60 and the complementary data line 45. One of a source and a drain of the N-type sixth transistor 36 is electrically connected to the complementary data line 45, and the other is electrically connected to the input terminal 26 of the second inverter 62 in the memory circuit 60 and to an output terminal 28 of the first inverter 62. That is, the other of the source and the drain of the N-type sixth transistor 36 is electrically connected to the gate of the second transistor 32 and the gate of the fourth transistor 34 and to the drain of the first transistor 31 and the drain of the third transistor 33. A gate of the sixth transistor 36 is electrically connected to the scan line 42.

The electro-optical device 10 according to the present exemplary embodiment includes the plurality of complementary data lines 45 in the display region E (see FIG. 5). One data line 43 and one complementary data line 45 correspond to one pixel circuit 41. Signals complementary to each other are supplied to the data line 43 and the complementary data line 45 paired up with the data line 43 for one pixel circuit 41. That is, a signal having a polarity reverse to a polarity of a signal supplied to the data line 43 is supplied to the complementary data line 45. The signal having the polarity reverse to the polarity of the signal supplied to the data line 43 is hereinafter referred to as a reverse signal. For example, when High is supplied to the data line 43, Low is supplied to the complementary data line 45 paired up with the data line 43. When Low is supplied to the data line 43, High is supplied to the complementary data line 45 paired up with the data line 43.

The fifth transistor 35 and the sixth transistor 36, which is a complementary transistor of the fifth transistor 35, are selecting transistors for the pixel circuit 41. The gate of the fifth transistor 35 and the gate of the sixth transistor 36 are electrically connected to the scan line 42. The fifth transistor 35 and the sixth transistor 36 simultaneously switch between the ON-state and an OFF-state in response to a selection signal or a non-selection signal, which is a scan signal supplied to the scan line 42.

When the selection signal is supplied to the scan line 42 as the scan signal, the fifth transistor 35 and the sixth transistor 36 are selected and are both brought into the ON-state. As a result, electrical communication is established between the data line 43 and the input terminal 28 of the first inverter 61 in the memory circuit 60 and, at the same time, electrical communication is established between the complementary data line 45 and the input terminal 26 of the second inverter 62 in the memory circuit 60.

In this way, a digital image signal is written to the input terminal 28 of the first inverter 61 from the data line 43 via the fifth transistor 35. Furthermore, a digital complementary image signal that is a reverse signal of a digital image signal is written to the input terminal 26 of the second inverter 62 from the complementary data line 45 via the sixth transistor 36. As a result, the digital image signal and the digital complementary image signal are stored in the memory circuit 60.

The digital image signal and the digital complementary image signal stored in the memory circuit 60 are maintained in a stable state until the fifth transistor 35 and the sixth transistor 36 are selected next and are both brought into the ON-state and a digital image signal and a digital complementary image signal are newly written from the data line 43 and the complementary data line 45, respectively.

Note that the polarity, the gate length, and the gate width of each transistor, drive conditions such as the potential of each transistor for the case where the scan signal is the selection signal, and the like are preferably defined to reduce an ON-resistance of the fifth transistor 35 below an ON-resistance of the second transistor 32 and an ON-resistance of the fourth transistor 34. Similarly, the polarity, the size, the drive conditions, and the like for each transistor are preferably defined to reduce an ON-resistance of the sixth transistor 36 below an ON-resistance of the first transistor 31 and an ON-resistance of the third transistor 33. In this way, a signal stored in the memory circuit 60 can be rewritten quickly and reliably.

The electro-optical device 10 according to the present exemplary embodiment includes the plurality of enable lines 44 in the display region E. The gate of the seventh transistor 37 is electrically connected to the enable line 44. The seventh transistor 37, which is a control transistor for the light emitting element 20, switches between the ON-state and the OFF-state in response to an active signal or an inactive signal that is a control signal supplied to the enable line 44.

When the active signal is supplied to the enable line 44 as the control signal, the seventh transistor 37 is brought into the ON-state. When the seventh transistor 37 is in the ON-state, the light emitting element 20 may emit light. On the other hand, when the inactive signal is supplied to the enable line 44 as the control signal, the seventh transistor 37 is brought into the OFF-state, preventing the light emitting element 20 from emitting light. When the seventh transistor 37 is in the OFF-state, the memory circuit 60 can rewrite a stored image signal without malfunctioning. This point will be described below.

In the present exemplary embodiment, the enable line 44 and the scan line 42 are independent of each other for each of the pixel circuits 41, and thus the fifth transistor 35 and the sixth transistor 36 operate independently from the seventh transistor 37. This ensures that the seventh transistor 37 is in the OFF-state whenever the fifth transistor 35 and the sixth transistor 36 are set to the ON-state.

In other words, when an image signal is written to the memory circuit 60, the seventh transistor 37 is brought into the OFF-state, and then, the fifth transistor 35 and the sixth transistor 36 are brought into the ON-state, to supply an image signal and a reverse signal of the image signal to the memory circuit 60. The seventh transistor 37 is in the OFF-state while the fifth transistor 35 and the sixth transistor 36 are in the ON-state. Thus, the light emitting element 20 does not emit light while an image signal is being written to the memory circuit 60. In this way, gray-scale by time division can be accurately expressed. In addition, while an image signal is being written to the memory circuit 60, the seventh transistor 37 blocks a path from the third potential line (high potential line 49) through the light emitting element 20 and the first transistor 31 to the second potential line (low potential line 46). This allows reliable rewriting of the potential of the output terminal 27 of the first inverter 61, i.e., the input terminal 26 of the second inverter 62.

After that, when the light emitting element 20 is caused to emit light, the fifth transistor 35 and the sixth transistor 36 are brought into the OFF-state, and then, the seventh transistor 37 is brought into the ON-state. When the first transistor 31 is in the ON-state at this time, electrical communication is established through a path leading from the third potential line (high potential line 49) through the seventh transistor 37, the light emitting element 20, and the first transistor 31 to the second potential line (low potential line 46), and a current flows through the light emitting element 20.

When the seventh transistor 37 is in the ON-state, the fifth transistor 35 and the sixth transistor 36 are in the OFF-state. Thus, neither an image signal nor a reverse signal of the image signal is supplied to the memory circuit 60 while the light emitting element 20 is being caused to emit light. In this way, an image signal stored in the memory circuit 60 is not mistakenly rewritten, and high-quality image display without false display can be achieved.

Relationship between Each Potential and Threshold Voltage of Transistor

As described above, in the present exemplary embodiment, the first potential (first high potential VDD1) and the second potential (low potential VSS) constitute the low-voltage power-supply, and the third potential (second high potential VDD2) and the second potential (low potential VSS) constitute the high-voltage power-supply. Such a configuration provides the electro-optical device 10 that operates at a high speed and achieves bright high-definition display. This will be described below.

In the following description, the first potential is expressed as V1, the second potential is expressed as V2, and the third potential is expressed as V3. In the present exemplary embodiment the potential difference (V1−V2=3.0 V) of the first potential (by way of example, V1=3.0 V) with respect to the second potential (by way of example, V2=0 V) is smaller than the potential difference (V3−V2=7.0 V) of the third potential (by way of example, V3=7.0 V) with respect to the second potential (V2=0 V, V1−V2<V3−V2). The potential difference of V1−V2 is the voltage of the low-voltage power-supply. The potential difference of V3–V2 is the voltage of the high-voltage power-supply.

With each of the potentials being set as described above, the low-voltage power-supply supplied with the first potential (V1) and the second potential (V2) causes the drive circuit 51 and the memory circuit 60 to operate, such that the transistors constituting the drive circuit 51 and the memory circuit 60 are scaled down, resulting in a high speed operation of these circuits. On the other hand, the high-voltage power-supply supplied with the third potential (V3) and the second potential (V2) causes the light emitting element 20 to emit light, such that luminance of the light emitting element 20 is increased. In other words, the configuration of the present exemplary embodiment enables each of the circuits to operate at a high speed and can provide the electro-optical device 10 in which the light emitting element 20 emits light at high luminance to provide bright state.

The light-emitting element such as an organic EL element generally requires a relatively high voltage of, e.g., 5 V or higher to emit light. However, in a semiconductor device, increasing the supply voltage necessitates increasing the gate length L and gate width W of the transistors in order to prevent malfunctioning. As a result, the circuits operate at a lower speed. On the other hand, decreasing the supply voltage in order to operate circuits at high speeds leads to a decreased luminance of the light-emitting element. In other words, in a typical configuration in prior art, in which the supply voltage used for emission of the light-emitting element and the supply voltage used to operate circuits are identical, it is difficult to achieve both high luminance emission of the light-emitting element and high-speed operation of the circuits.

In contrast, the present exemplary embodiment uses a low-voltage power-supply and a high-voltage power-supply as the power supplies for the electro-optical device 10 and a low-voltage power-supply as the power supply for the operation of the drive circuit 51 and the memory circuit 60. In this way, the size of each of the transistors constituting the drive circuit 51 and the memory circuit 60 except for the first transistor 31 is reduced such that L=approximately 0.5 micrometer (μm), which is smaller than L=approximately 0.75 micrometer (μm) of the first transistor 31, which also serves as a driving transistor, and the seventh transistor 37, which is a control transistor. These circuits are further driven at a low voltage of V1–V2=3.0 V. This allows high speed operation of the drive circuit 51 and the memory circuit 60.

Then, the high-voltage power supply causes the light emitting element 20 to emit light at a high voltage of V4–V3=7.0 V, such that the light emitting element 20 is caused to emit light at high luminance. Furthermore, as will be described later, the first transistor 31 and the seventh transistor 37 disposed in series with the light emitting element 20 are linearly operated, such that most of high voltage of V3–V2=7.0 V is applied to the light emitting element 20. This further increases luminance of light emitted by the light emitting element 20.

In the present exemplary embodiment, the threshold voltage ($V_{th1}$) of the first transistor 31, which is a driving transistor, is positive (0<$V_{th1}$). When an image signal stored in the memory circuit 60 corresponds to non-emission, the potential of the output terminal 27 of the first inverter 61 is High, i.e. the first potential (V1). At this time, the input terminal 28 of the first inverter 61, i.e. the gate of the first transistor 31, has a Low potential, i.e. the second potential (V2). The source of the first transistor 31 is connected to the second potential line (low potential line 46), and thus, both the source potential and a gate potential of the first transistor 31 are the second potential (V2). Consequently, the first transistor 31 has a gate-source voltage $V_{gs1}$ of 0 V.

Therefore, with the threshold voltage $V_{th1}$ of the first transistor 31 (by way of example, $V_{th1}$=0.36 V) being positive (0<$V_{th1}$), the gate-source voltage $V_{gs1}$ of the N-type first transistor 31 is smaller than the threshold voltage $V_{th1}$, turning the first transistor 31 into the OFF-state. Thus, the first transistor 31 is reliably placed in the OFF-state when the image signal indicates non-emission.

In the present exemplary embodiment, the potential difference of the first potential (V1) with respect to the second potential (V2) as a reference potential is greater than the threshold voltage $V_{th1}$ of the first transistor 31 ($V_{th1}$<V1–V2). When an image signal stored in the memory circuit 60 corresponds to emission, the potential of the output terminal 27 in the memory circuit 60 is Low. At this time, the input terminal 28 of the first inverter 61, i.e. the gate of the first transistor 31, has a High potential, i.e. the first potential (V1), and thus, the gate-source voltage $V_{gs1}$ of the first transistor 31 is equal to the potential difference of the first potential (V1) with respect to the second potential (V2) ($V_{gs1}$=V1–V2=3.0 V–0 V=3.0 V).

In a case where the potential difference between the first potential (V1) and the second potential (V2) (V1–V2=3.0 V) is greater than the threshold voltage $V_{th1}$ ($V_{th1}$=0.36 V) of the first transistor 31 ($V_{th1}$<V1–V2), the gate-source voltage $V_{gs1}$ of the N-type first transistor 31 is greater than the threshold voltage $V_{th1}$ when the potential of the output terminal 27 in the memory circuit 60 is Low. As a result, the first transistor 31 is then in the ON-state. Thus, the first transistor 31 is reliably placed in the ON-state when the image signal indicates emission.

The seventh transistor 37, which is a control transistor, is in the OFF-state while supplied with an inactive signal as the control signal from the enable line 44 electrically connected to the gate of the seventh transistor 37, and in the ON-state while supplied with an active signal as the control signal from the enable line 44. In the present exemplary embodiment, since the seventh transistor 37 is of the P-type, the seventh potential (V7) that is the potential of the inactive signal is set to a high potential higher than or equal to the third potential (V3) and is preferably equal to the third potential (V3), as described above. Furthermore, the sixth potential (V6) that is the potential of the active signal is set to a low potential lower than or equal to V3–(V1–V2) and is preferably equal to the second potential (V2).

When the inactive signal of the third potential (V3) is supplied from the enable line 44 to the gate of the seventh transistor 37, both a source potential and a gate potential of the seventh transistor 37 are set to the third potential (V3), and a gate-source voltage $V_{gs7}$ of the seventh transistor 37 is 0 V. With the threshold voltage of the P-type seventh transistor 37 being $V_{th7}$ ($V_{th7}$=0.36 V by way of example), since the gate-source voltage $V_{gs7}$ of the seventh transistor 37 is greater than the threshold voltage $V_{th7}$, the seventh transistor 37 is in the OFF-state. Therefore, the seventh transistor 37 can be reliably placed in the OFF-state when the control signal is the inactive signal.

When an active signal of a potential lower than or equal to V3–(V1–V2), e.g. lower than or equal to 7.0 V–(3.0 V–0 V)=4.0 V, is supplied from the enable line 44, the gate-source voltage $V_{gs7}$ of the seventh transistor 37 is set lower than or equal to 4.0–7.0 V=–3.0 V. Therefore, the gate-source voltage $V_{gs7}$ of the seventh transistor 37 is set sufficiently lower than the threshold voltage $V_{th7}$. This allows the seventh transistor 37 to be reliably placed in the OFF-state when the control signal is the inactive signal.

The gate-source voltage $V_{gs7}$ of the seventh transistor 37 increases with decreasing potential of the active signal. With the potential of the active signal set to the second potential (V2), the gate-source voltage $V_{gs7}$ of the seventh transistor 37 is 0 V−7.0 V=−7.0 V, and thus, the seventh transistor 37 reduces ON-resistance in the ON-state. This makes the light emitting element 20 less susceptible to variations in the threshold voltage of the seventh transistor 37 during light emission from the light emitting element 20.

The highest of the existing first, second, and third potentials, i.e. the third potential (V3), is set to the seventh potential (V7) of the inactive signal, and the lowest of the existing first, second, and third potentials, i.e. the second potential (V2), is set to the sixth potential (V6) of the active signal. With this setting, the potentials of the inactive signal and the active signal are set without adding any other potential lines through which new potentials are supplied. The active signal enables a sufficient increase in the absolute value of the gate-source voltage of the seventh transistor 37. The seventh transistor 37 thus offers a sufficiently reduced ON-resistance in the ON-state, substantially eliminating the possible adverse effect, on the luminance of the light-emitting element, of variations in the threshold voltage of the seventh transistor 37.

In other words, in the configuration of the present exemplary embodiment, even with two different electrical systems of the low-voltage power-supply and the high-voltage power-supply, the first transistor 31 and the seventh transistor 37 are placed into the OFF-state when the light emitting element 20 is to be prevented from emitting light, allowing the light emitting element 20 to be reliably prevented from emitting light. The first transistor 31 and the seventh transistor 37 are also placed into the ON-state when the light emitting element 20 is to emit light, allowing the light emitting element 20 to reliably emit light.

Furthermore, the fifth transistor 35, which is a selecting transistor, and the sixth transistor 36, which is a complementary selecting transistor, are brought into the OFF-state when supplied with a non-selection signal as the scan signal from the scan line 42 eclectically connected to the gate of each transistor, and into the ON-state when supplied with a selection signal. In the present exemplary embodiment, the fifth transistor 35 and the sixth transistor 36 are of the N-type, and thus, the fifth potential (V5), which is the potential of the non-selection signal, is set to a low potential lower than or equal to the second potential (V2) and is preferably equal to the second potential (V2), as described above. Furthermore, the fourth potential (V4), which is the potential of the selection signal, is set to a high potential higher than or equal to the first potential (V1) and is preferably equal to the third potential (V3).

The first transistor 31, the fifth transistor 35, and the sixth transistor 36 preferably have an identical polarity. In First Exemplary Embodiment, the first transistor 31, the fifth transistor 35, and the sixth transistor 36 are all of the N-type. Therefore, the first transistor 31 is brought into the ON-state when the image signal supplied to the gate of the first transistor 31 has the High potential, and the fifth transistor 35 and the sixth transistor 36 are brought into the ON-state when the scan signal supplied to the gate of each transistor has the High potential, i.e., is the selection signal. The first transistor 31 also serves as a driving transistor for the light emitting element 20 and includes the source fixed to the second potential (V2). Thus, for an increased voltage applied to the light emitting element 20, the third potential (V2) is increased above the first potential (V1). In this case, the High potential of the image signal is the first potential (V1). However, the fourth potential (V4) of the selection signal (High) is set higher than or equal to the first potential (V1) and is preferably equal to the third potential (V3).

A case will be described where the fourth potential (V4) of the selection signal is set to the third potential (V3) and where an image signal in the memory circuit 60 is rewritten from Low to High. The input terminal 28 of the first inverter 61 (=the output terminal 25 of the second inverter 62), to which one of the source and the drain of the fifth transistor 35 is electrically connected, has the second potential (V2), which is Low, before the image signal is rewritten. When the gate of the fifth transistor 35 is supplied with the selection signal of the third potential (V3) through the scan line 42, a gate-source voltage $V_{gs5}$ of the fifth transistor 35 is set to V3−V2=7.0 V−0 V=7.0 V, which is higher than the threshold voltage $V_{th5}$ of the fifth transistor 35 (by way of example, $V_{th5}$=0.36 V). This turns the fifth transistor 35 into the ON-state.

When a High (V1) image signal is written to the memory circuit 60 through the data line 43, the potential of the output terminal 25 of the second inverter 62 gradually increases from Low (V2) to High (V1). Correspondingly, the gate-source voltage $V_{gs5}$ of the fifth transistor 35 gradually decreases to V3−V1=7.0 V−3.0 V=4.0 V. Even when the gate-source voltage $V_{gs5}$ of the fifth transistor 35 reaches the smallest value, i.e., 4.0 V, the gate-source voltage $V_{gs5}$ of the fifth transistor 35 is sufficiently higher than the threshold voltage $V_{th5}$ of the fifth transistor 35. Thus, until the image signal is written to the memory circuit 60, the ON-resistance of the fifth transistor 35 remains low, allowing the image signal to be reliably written to the memory circuit 60.

Here, the fifth transistor 35 is assumed to be of the P-type, which is different from the conductivity type of the first transistor 31 (in this ease, the fifth transistor is represented as 35A). In this case, the fifth transistor 35A is in the ON-state when the selection signal is Low. In a case where the fourth potential (V4) of the selection signal is set equal to the second potential (V2) and where an image signal in the memory circuit 60 is rewritten from High (V1) to Low (V2), supply of the selection signal of the second potential (V2) through the scan line 42 sets the gate-source voltage $V_{gs5}$ of the fifth transistor 35A to V2−V1=0 V−3.0 V=−3.0 V, which is lower than the threshold voltage $V_{th5}$ of the fifth transistor 35A (by way of example, $V_{th5}$=−0.36 V). The fifth transistor 35A is thus brought into the ON-state.

When a Low (V2) image signal is written to the memory circuit 60 through the data line 43, the potential of the input terminal 28 of the first inverter 61 gradually decreases from High (V1). Correspondingly, a gate-source voltage $V_{gs5}$ of the fifth transistor 35A gradually increases from −3.0 V. The gate-source voltage $V_{gs5}$ reaches the threshold voltage $V_{th5}$ of the P-type fifth transistor 35A before the potential of the input terminal 28 reaches the second potential (V2), turning the fifth transistor 35A into the OFF-state.

Furthermore, before the fifth transistor 35A is brought into the OFF-state, the ON-resistance of the fifth transistor 35A increases as the gate-source voltage $V_{gs5}$ increases and approaches the threshold voltage $V_{th5}$. This leads to a need for a long time for rewriting of an image signal in the memory circuit 60 or a failure in rewriting. To avoid this, the fourth potential (V4) of the selection signal may be set to a smaller value. However, this results in a need for a further potential line with a potential different from the exiting potentials.

When the first transistor 31 and the fifth transistor 35 are of the N-type and thus have the identical polarity as in First Exemplary Embodiment, the fourth potential (V4) of the selection signal may be set equal to the third potential (V3), which is the highest potential between the third potential (V3) and the first potential (V1), without a need for a new potential line. When the fifth transistor 35 is brought into the ON-state to write an image signal to the memory circuit 60, the fifth transistor 35 may have an increased gate-source voltage $V_{gs5}$, allowing the ON-resistance of the fifth transistor 35 to be kept low even with an increase in the source potential of the fifth transistor 35 resulting from writing of the image signal. This allows writing of an image signal to the memory circuit 60 or rewriting of an image signal in the memory circuit 60 to be reliably achieved at a high speed. The fifth transistor 35 has been described. However, the above description also applies to the sixth transistor 36, which is a complementary transistor for the fifth transistor 35. The sixth transistor 36 offers a lower ON-resistance than the first transistor 31 and the third transistor 33.

From the above-described results, preferred relationships between each of the potentials (V1, V2, and V3) and the threshold voltage ($V_{th1}$) of the first transistor 31 in the present exemplary embodiment can be derived and expressed by Expression 3 and Expression 4 below:

[Expression 3]

$$0 < Vth1 \qquad (3)$$

[Expression 4]

$$V2 + Vth1 < V1 < V3 \qquad (4)$$

Characteristics of Transistors

Now, characteristics of the transistors provided in the pixel circuit 41 according to First Exemplary Embodiment will be described. In the pixel circuit 41 according to First Exemplary Embodiment, the first transistor 31 and the seventh transistor 37 are disposed in series with the light emitting element 20 between the third potential line (high potential line 49) and the second potential line (low potential line 46), constituting the high-voltage power-supply. The ON-resistance of the first transistor 31 is preferably sufficiently lower than the ON-resistance of the light emitting element 20, The ON-resistance of the seventh transistor 37 is also preferably sufficiently lower than the ON-resistance of the light emitting element 20.

The expression "sufficiently low" refers to a drive condition in which the first transistor 31 and the seventh transistor 37 operates in a linear fashion and, specifically, to a state in which the ON-resistance of the first transistor 31 and the seventh transistor 37 is less than or equal to $\frac{1}{100}$, preferably less than or equal to $\frac{1}{1000}$ of the ON-resistance of the light emitting element 20. In this way, the first transistor 31 and the seventh transistor 37 can be linearly operated when the light emitting element 20 emits light.

As a result, most of the potential drop occurring in the first transistor 31, the seventh transistor 37, and the light emitting element 20 arranged in series is applied to the light emitting element 20, such that the light emitting element 20 is less susceptible to variation in the threshold voltage of both of the transistors 31 and 37 during light emission from the light emitting element 20. In other words, most of the potential difference between the third potential and the second potential constituting the voltage of the high-voltage power-supply is applied to the light-emitting element. Thus, the light-emitting element is less susceptible to variation in the threshold voltage of both transistors 31 and 37 during light emission from the light emitting element 20. In other words, such a configuration can reduce the effect of variation in the threshold voltage of the first transistor 31 and the seventh transistor 37 and can thus minimize the variations in brightness and shifts in gray-scale among the pixels 59, i.e., the sub-pixels 58. As a result, image display with excellent uniformity can be achieved.

This is because the ON-resistance of the first transistor 31 and the seventh transistor 37 is set equal to $\frac{1}{100}$ or less of the ON-resistance of the light emitting element 20 to reduce the potential drop across the first transistor 31 and the seventh transistor 37 to 1% or less of the power supply voltage, with 99% or greater of the power supply voltage being received by the light emitting element 20. Since the potential drop across the transistors 31 and 37 is as small as 1% or less, the effect of variation in the threshold voltage of the transistors 31 and 37 on the emission characteristic of the light emitting element 20 is reduced.

In the present exemplary embodiment, the series resistance of the first transistor 31 and the seventh transistor 37 is approximately $\frac{1}{1000}$ of the ON-resistance of the light omitting element 20. In this case, since the light emitting element 20 receives approximately 99.9% of power supply voltage and the potential drop across the transistors 31 and 37 is reduced to approximately 0.1% of the power supply voltage, the effect of variation in the threshold voltage of the transistors 31 and 37 on the emission characteristic of the light emitting element 20 is almost negligible.

The ON-resistance of a transistor depends on the polarity, gate length, gate width, threshold voltage, gate-insulating-film thickness, and the like of the transistor. In the present exemplary embodiment, the polarity, gate length, gate width, threshold voltage, gate-insulating-film thickness, and other characteristics of both of the first transistor 31 and the seventh transistor 37 are preferably determined in such a way that the ON-resistance of the first transistor 31 and the seventh transistor 37 is sufficiently lower than the ON-resistance of the light emitting element 20. This will be described below.

In the present exemplary embodiment, the organic EL element is used in the light emitting element 20, and the transistors such as the first transistor 31 and the seventh transistor 37 are formed on the element substrate 11 formed of a single crystal silicon wafer. A voltage-current characteristic of the light emitting element 20 is roughly expressed by Expression 5 below:

[Expression 5]

$$I_{EL} = L_{EL} W_{EL} J_0 \left\{ \exp\left(\frac{V_{EL} - V_0}{V_{tm}}\right) - 1 \right\} \qquad (5)$$

In Expression 5, $I_{EL}$ is a current flowing through the light emitting element 20, $V_{EL}$ is a voltage applied to the light emitting element 20, $L_{EL}$ is the length of the light emitting element 20 in a plan view, $W_{EL}$ is the width of the light emitting element 20 in the plan view, $J_0$ is a current density coefficient of the light emitting element 20, $V_{tm}$ is a coefficient voltage of the light emitting element 20 having a temperature dependence, and $V_0$ is a threshold voltage of emission of the light emitting element 20. Here, the coefficient voltage $V_{tm}$ of the light emitting element 20 having a temperature dependence is constant at a constant temperature.

Note that, provided that the voltage of the high-voltage power-supply is expressed as $V_p$ and the potential drop occurring across the first transistor 31 and the seventh transistor 37 is expressed as $V_{ds}$, then $V_{EL}+V_{ds}=V_p$. In the present exemplary embodiment, $L_{EL}=11$ micrometers (μm), $W_{EL}=3$ micrometers (μm), $J_0=1.449$ milliamperes per square centimeters (mA/cm$^2$), $V_0=3.0$ volts (V), and $V_{tm}=0.541$ volt (V).

On the other hand, when the first transistor 31 and the seventh transistor 37 are expressed as an i-th transistor (i is 1 or 4), a drain current $I_{dsi}$ of the i-th transistor is expressed by Expression 6 below:

[Expression 6]

$$I_{dsi} = \frac{W_i}{L_i} \cdot \frac{\varepsilon_0 \varepsilon_{ox}}{t_{oxi}} \cdot \mu_i (V_{gsi} - V_{thi}) V_{dsi} \equiv Z_i (V_{gsi} - V_{thi}) V_{dsi} \quad (6)$$

In Expression 6, $W_i$ is the gate width of the i-th transistor, $L_i$ is the gate length of the i-th transistor, $\varepsilon_0$ is the permittivity of vacuum, $\varepsilon_{ox}$ is the permittivity of a gate insulating film, $t_{oxi}$ is the thickness of the gate insulating film, $\mu_i$ is the mobility of the i-th transistor, $V_{gsi}$ is the gate voltage, $V_{dsi}$ is the drain voltage corresponding to a potential drop due to the i-th transistor, and $V_{thi}$ is the threshold voltage of the i-th transistor.

In the present exemplary embodiment, $W_1=1.0$ micrometer (μm), $W_7=1.25$ micrometers (μm), $L_1=L_7=0.75$ micrometer (μm), $t_{ox}=20$ nanometers (nm), $\mu_1=240$ square centimeters per volt per second (cm$^2$/V·s), $\mu_7=150$ square centimeters per volt per second (cm$^2$/V·s), $V_{th1}=0.36$ V, $V_{th7}=-0.36$ V, $V_{gs1}=V1-V2=3.0$ V, and $V_{gs7}=V2-V3=-7.0$ V.

Note that, when the first transistor 31 and the seventh transistor 37 are linearly operated, the voltage-current characteristic of the light emitting element 20 is approximated by Expression 7 below around $V_{ds}=0$ V by using a potential drop $V_{ds}$ at both of the transistors 31 and 37.

[Expression 7]

$$I_{EL} = -kV_{ds} + I_0 \quad (7)$$

In the present exemplary embodiment, the coefficient k defined by Expression 7 is $k=1.39\times10^{-6}$ ($\Omega^{-1}$). $I_0$ is the amount of current when all voltage $V_p$ of the high-voltage power-supply is applied to the light emitting element 20, and $I_0=7.82\times10^{-7}$ (A).

Under such conditions, the voltage at which the light emitting element 20 emits light is a voltage that satisfies $I_{EL}=I_{ds}$ based on Expressions 5 and 7. In the present exemplary embodiment, $V_p=V3-V2=7.0$ V, $V_{ds1}=0.0053$ V, $V_{ds7}=0.0027$ V, $V_{EL}=6.9920$ V, and $I_{EL}=I_{ds1}=I_{ds7}=7.672\times10^{-7}$ A. At this time, the ON-resistance of the first transistor 31 was $6.859\times10^3 \Omega$, the ON-resistance of the seventh transistor 37 was $3.491\times10^3 \Omega$, and the ON-resistance of the light emitting element 20 was $9.113\times10^6 \Omega$.

Therefore, the ON-resistance of the first transistor 31 was approximately 1/1300 of the ON-resistance of the light emitting element 20, which is lower than 1/1000 of the ON-resistance of the light emitting element 20, and the ON-resistance of the seventh transistor 37 was approximately 1/2600 of the ON-resistance of the light emitting element 20, which is lower than 1/1000 of the ON-resistance of the light emitting element 20. In this manner, most of the voltage of the high-voltage power-supply was successfully applied to the light emitting element 20.

Under this condition, even when the threshold voltage of the transistor varies 30% or greater, $V_{EL}=6.99$ V and $I_{EL}=I_{ds1}=I_{ds7}=7.67\times10^{-7}$ A are invariable. Specifically, in the present exemplary embodiment, even when $V_{th1}$ or $V_{th7}$ varies between 0.29 V and 0.53 V, $V_{EL}=6.99$ V and $I_{ds1}=I_{ds7}=7.67\times10^{-7}$ A are invariable. Typically, the threshold voltage of the transistor does not greatly vary in such a manner. Therefore, decreasing the ON-resistance of the seventh transistor 37 to approximately 1/1000 or below of the ON-resistance of the light emitting element 20 substantially eliminates the effect of variation in the threshold voltage of the first transistor 31 and the seventh transistor 37 on the luminance of the light emitting element 20.

By simultaneously solving Expression 6 and Expression 7 with $I_{EL}=I_{dsi}$, the effect of variation in the threshold voltage of the i-th transistor on the current $I_{EL}=I_{dsi}$ can be approximated by Expression 8 below:

[Expression 8]

$$\left(1 + \frac{k}{Z_i(V_{gsi} - V_{thi})}\right) I_{EL} = I_0 \quad (8)$$

Since $I_p$ is the amount of current when all the voltage $V_p$ of the high-voltage power-supply is applied to the light emitting element 20, the gate voltage $V_{gsi}$ and $Z_i$ may be increased to cause the light emitting element 20 to emit light around the power supply voltage $V_p$ as seen from Expression 8. In other words, the luminance of the light emitting element 20 becomes less susceptible to variation in the threshold voltage of a transistor as $Z_i$ increases.

Since $k/Z_1=2.52\times10^{-2}$ V and $k/Z_7=3.22\times10^{-2}$ V have small values in the present exemplary embodiment, the second term on the left side of Expression 8 is $k/(Z_1(V_{gs1}-V_{th1}))=0.01$ for the first transistor 31 and $k/(Z_7(V_{gs7}-V_{th7}))=0.005$ for the seventh transistor 37, and is thus less than approximately 0.01 (1%). As a result, the current (luminance) that flows when the light emitting element 20 emits light is not substantially affected by the threshold voltage of both of the transistors 31 and 37. In other words, setting the value of $k/(Z_i(V_{gsi}-V_{thi}))$ to be less than approximately 0.01 (1%) enables substantial elimination of the effect of variation in the threshold voltages ($V_{th1}$ and $V_{th7}$) of both of the transistors 31 and 37 on the luminance of the light emitting element 20.

In Expression 8, k and Z are defined by Expressions 6 and 7. Note that, since the mobility $\mu_i$ of the P-type transistor is smaller than the mobility $\mu_i$ of the N-type transistor, W ($W_7$ in the present exemplary embodiment) of the P-type transistor is set greater than W ($W_j$ in the present exemplary embodiment) of the N-type transistor. In the present exemplary embodiment, $W_7$ of the P-type transistor is set greater than $W_1$ of the N-type transistor, and $Z_7$ of the P-type seventh transistor 37 is set substantially identical to $Z_1$ of the N-type first transistor 31.

The gate voltage $V_{gsi}$ may preferably be as high as possible in order to cause emission of the light emitting element 20 near the power supply voltage $V_p$. In the present exemplary embodiment, the sixth potential (V6), which is the potential of the control signal in the active state (active signal), is set equal to the second potential (V2) with respect to the third potential (V3), which is the source potential of the seventh transistor 37, to increase the gate-source voltage $V_{gs7}$ of the seventh transistor 37.

Now, the description is given that the present exemplary embodiment has eliminated the disadvantage of the known electro-optical device described in JP-A-2002-287695 that the light-emitting element may fail to emit light when the light-emitting element is to emit light. The results of the inventors' sincere studies indicate that an inverter in the known organic EL device may be logic-inversion when a light-emitting element is to emit light and that the logical inversion is the cause of the above-described disadvantage. Specifically, when the light-emitting element is to emit light as a result of an output of an output inverter in JP-A-2002-287695 becoming High potential to cause a current to flow through a P-type driving transistor and the light-emitting element, a potential drop may be caused by the ON-resistance of the P-type driving transistor to reduce the output potential of the output inverter below a reference potential. In a case where the potential significantly drops to exceed a logic-inversion potential, emission logic is inverted and the inverted logic is fed back as non-emission logic, thus preventing the light-emitting element from emitting light. The inventors have found the inversion to be the cause of the disadvantage of the known organic EL device. Thus, in the present exemplary embodiment, the gate length, the gate width, the drive conditions, and the like for each transistor are set to prevent the potential of the output terminal 27 of the first inverter 61 included in the memory circuit 60 from being higher than or equal to the logic-inversion potential of the first inverter 61, i.e., to prevent the emission logic from being inverted, even in a case where the light emitting element 20 emits light.

For the pixel circuit 41 illustrated in FIG. 8, Expression 9 illustrated below expresses a condition for preventing the potential of the output terminal 27 of the first inverter 61 from being higher than or equal to the logic-inversion potential even when the light emitting element 20 emits light. In Expression 9, $V_1$ represents the first potential, $V_2$ represents the second potential, $V_3$ represents the third potential, $R_{EL}$ represents the ON-resistance of the light emitting element 20 during light emission, and $R_T$ represents the ON-resistance of the first transistor 31 in the emission state, which is the ON-state of the light emitting element 20.

[Expression 9]

$$\frac{R_T}{R_{EL} + R_T} \cdot (V_3 - V_2) + V_2 < \frac{V_1 + V_2}{2} \quad (9)$$

The right side of Expression 9 represents a logic-inversion potential of the first inverter 61, which is an intermediate potential between the first potential ($V_1$) and the second potential (V2), which serves as a reference potential. The intermediate potential is the sum of the second potential ($V_2$) and an half of the potential difference between the first potential and the second potential. Since the logical inversion is likely to occur when the ON-resistance of the seventh transistor 37 is negligibly small, we will consider the worst situation where the logical inversion is most likely to occur, i.e. where the seventh transistor 37 offers an ON-resistance of zero. In this worst situation, the left side of Expression 9 represents the potential of the output terminal 27 of the first inverter 61, which is the drain potential of the first transistor 31, during light emitting state from the light emitting element 20. The potential of the output terminal 27 is the sum of the second potential ($V_2$) and the potential drop occurred through the first transistor 31. The sum of the potential drop occurred through the first transistor 31 and the potential drop occurred through the light emitting element 20 is the potential difference between the third potential (V3) and the second potential (V2), because the light emitting element 20 and the first transistor 31 are disposed in series between these potentials. Expression 9 may be rearranged to obtain Expression 10 below:

[Expression 10]

$$R_T < \frac{V_1 - V_2}{2V_3 - V_1 - V_2} \cdot R_{EL} \quad (10)$$

To prevent the potential of the output terminal 27 of the first inverter 61 from being higher than or equal to the logic-inversion potential even in a case where the light emitting element 20 emits light, the gate length, the gate width, the drive conditions, and the like for the transistor (in the present exemplary embodiment, the first transistor 31) are set to satisfy the relationship in Expression 10. In the present exemplary embodiment, the gate length $L_1$, the gate width $W_1$, the drive conditions, and the like for the first transistor 31 are set to satisfy the relationship in Expression 10.

As described above, in the present exemplary embodiment, the ON-resistance of the first transistor 31 was $6.859 \times 10^3 \Omega$, and the ON-resistance of the light emitting element 20 was $9.113 \times 10^6 \Omega$. Thus, the right side of Expression 10 is equal to $2.485 \times 10^6 \Omega$, which is sufficiently greater than $6.859 \times 10^3 \Omega$ on the left side, thus preventing the first inverter 61 from being logic-inversion even when the light emitting element 20 emits light. This allows the light emitting element 20 to reliably emit light when the light emitting element 20 is to emit light.

Furthermore, in the electro-optical device 10 according to the present exemplary embodiment, the first transistor 31 and the third transistor 33, constituting the first inverter 61 included in the memory circuit 60, and the second transistor 32 and the fourth transistor 34, constituting the second inverter 62, are disposed between the first potential line (high potential line 47) and the second potential line (low potential line 46), constituting the low-voltage power-supply.

The transistors 32, 33, and 34, i.e., the transistors included in the memory circuit 60 except the first transistor 31, have a smaller amount of flowing current than the first transistor 31 or the seventh transistor 37 to which voltage of the high-voltage power-supply is supplied, enabling a reduction in the size of a channel formation area. That is, the memory circuit 60 can be miniaturized. The reduced channel formation area for the transistors 32, 33, and 34 reduces transistor capacitance, allowing charge and discharge to be achieved at a high speed. This allows writing of an image signal to the memory circuit 60 or rewriting of an image signal in the memory circuit 60 to be achieved at a high speed.

In the present exemplary embodiment, the second transistor 32, the third transistor 33, and the fourth transistor 34, included in the memory circuit 60, have, in a plan view, a smaller gate length than the first transistor 31 and the seventh transistor 37, disposed in series with the light emitting element 20.

The gate lengths of the second transistor 32, the third transistor 33, and the fourth transistor 34 in a plan view are such that $L_2 = L_3 = L_4 = 0.5$ micrometers (μm). As described above, the gate lengths of the first transistor 31 and the seventh transistor 37 in a plan view are such that $L_1=L_7=0.075$ micrometers (μm). Thus, the second transistor 32, the third transistor 33, and the fourth transistor 34 each have a smaller gate length than the first transistor 31 and the seventh transistor 37.

In other words, the gate length $L_1$ of the first transistor 31, among the transistors included in the memory circuit 60, is larger than the gate lengths $L_2$, $L_3$, and $L_4$ of the other transistors 32, 33, and 34, respectively. Thus, a large current causing the light emitting element to emit light may be passed through the first transistor 31, and the first transistor 31 may be less susceptible to destruction even in a case where a maximum voltage of the high-voltage power-supply is applied to the first transistor 31. On the other hand, the gate lengths $L_2$, $L_3$, and $L_4$ of the other transistors 32, 33, and 34 for static storage operations are each smaller than the gate length $L_1$, of the first transistor 31, thus allowing the memory circuit 60 to be miniaturized and operated at a high speed.

In the first inverter 61, the gate width $W_3$ of the P-type third transistor 33, disposed in series with the N-type first transistor 31, is preferably set in association with characteristics of the first transistor 31 such that the first inverter 61 has a logic-inversion potential equal to the intermediate potential between the first potential and the second potential. Specifically, the ON-resistance of the first transistor 31 in the ON-state (on current) is preferably equal to the ON-resistance of the third transistor 33 in the ON-state (on current).

To satisfy these conditions, the gate width $W_3$ of the third transistor 33 may be set in Expression 6 such that $Z_3$ of the third transistor 33 is equal to $Z_1$ of the first transistor 31. In Expression 6, in a case where $\varepsilon_0$, $\varepsilon_{ox}$, and $t_{ox}$ are identical, the gate length $L_1$ of the first transistor 31 is $L_1=0.75$ micrometers (μm), the gate width $W_1$ of the first transistor 31 is $W_1=1.0$ micrometers (μm), and the gate length $L_3$ of the third transistor 33 is $L_3=0.5$ micrometers (μm). The mobility $\mu_3$ of the P-type third transistor 33 ($\mu_3=1.50$ cm$^2$/V·s) is smaller than the mobility $\mu_1$ of the N-type first transistor 31 ($\mu_1=240$ cm$^2$/V·s). The gate width $W_3$ of the third transistor 33 is then determined to be $W_3=1.1$ micrometers (μm) in accordance with Expression 6 by using the ratio between the mobilities $\mu_1$ and $\mu_3$.

The N-type second transistor 32, included in the second inverter 62, has no flow of such a large current as in the first transistor 31, included in the first inverter 61, and thus, the gate width $W_2$ of the second transistor 32 is $W_2=0.5$ micrometers (μm). A gate width $W_4$ of the P-type fourth transistor 34, disposed in series with the second transistor 32, is determined to be $W_4=0.8$ micrometers (μm) in accordance with Expression 6 such that the second inverter 62 has a logic-inversion potential equal to the intermediate potential between the first potential and the second potential.

The gate width $W_1$ of the first transistor 31 is $W_1=1.0$ micrometer (μm) and is thus larger than the gate width $W_2$ of the second transistor 32. The first transistor 31 and the second transistor 32 are of the identical conductivity type. However, since the first transistor 31 also serves as the driving transistor for the light emitting element 20, the larger gate width $W_1$ allows the ON-resistance of the first transistor 31 to be prevented from increasing even when a large current flows through the first transistor 31 during light emission from the light emitting element 20.

Furthermore, the gate width $W_3$ of the third transistor 33 is set in association with the characteristics of the first transistor 31. The gate width $W_4$ of the fourth transistor 34 is set in association with the characteristics of the second transistor 32. As a result, the gate width $W_3$ of the third transistor 33 is larger than the gate width $W_4$ of the fourth transistor 34. In this way, the logic-inversion potential of the first inverter 61 and the logic-inversion potential of the second inverter 62 may each be the intermediate potential between the first potential and the second potential. As a result, whereas the size of the channel formation area of the first transistor 31 is 0.75×1.0=0.75 square micrometers (μm$^2$), the size of the channel formation area of the third transistor 33 is 0.5×1.1=0.55 square micrometers (μ$^2$), the size of the channel formation area of the second transistor 32 is 0.5×0.5=0.25 square micrometers (μm$^2$), and the size of the channel formation area of the fourth transistor 34 is 0.5×0.8=0.4 square micrometers (μm$^2$). Therefore, the channel formation area of each of the second transistor 32, the third transistor 33, and the fourth transistor 34 is smaller in size than the channel formation area of the first transistor 31.

As described above, in the present exemplary embodiment, the channel formation area of each of the transistors 32, 33, and 34 among the transistors included in the memory circuit 60 is smaller in size than the channel formation area of the first transistor 31, disposed in series with the light emitting element 20. This enables the memory circuit 60 to be scaled down and operated at a high speed, and all the first inverter 61 and the second inverter 62 to perform normal logical inversion operations.

Furthermore, when an image signal in the memory circuit 60 is rewritten via the fifth transistor 35, which is a selecting transistor, and the sixth transistor 36, which is a complementary transistor, high ON-resistance of the fifth transistor 35 and the sixth transistor 36 in the ON-state may lead to a need for a long time for rewriting of the image signal in the memory circuit 60 or a failure in rewriting.

To rewrite an image signal in the memory circuit 60, the fifth transistor 35 preferably offers a lower ON-resistance than the second transistor 32 and the fourth transistor 34 included in the second inverter 62, and more preferably offers an ON-resistance that is half or less of the ON-resistance of each of the second transistor 32 and the fourth transistor 34. In a case where the fifth transistor 35 offers a lower ON-resistance than the second transistor 32 and the fourth transistor 34, a potential drop due to the fifth transistor 35 when an image signal is rewritten may be made smaller than half of the potential difference between the first potential (V1) and the second potential (V2). In a case where the fifth transistor 35 offers an ON-resistance that is half or less of the ON-resistance of each of the second transistor 32 and the fourth transistor 34, a potential drop due to the fifth transistor 35 when an image signal is rewritten may be made approximately one-third of the potential difference between the first potential (V1) and the second potential (V2).

Similarly, to rewrite an image signal in the memory circuit 60, the sixth transistor 36 preferably offers a lower ON-resistance than the first transistor 31 and the third transistor 33, included in the first inverter 61, and more preferably offers an ON-resistance that is half or less of the ON-resistance of each of the first transistor 31 and the third transistor 33. Accordingly, a potential drop due to the sixth transistor 36 when an image signal is rewritten may be made smaller than half of the potential difference between the first potential (V1) and the second potential (V2) or may be made approximately one-third of the potential difference between the first potential (V1) and the second potential (V2).

Each of the N-type fifth transistor 35 and the N-type sixth transistor 36 is supplied with the first potential (V1) and the second potential (V2) as an image signal and a complementary image signal, respectively. Therefore, gate lengths $L_5$ and $L_6$ and gate widths $W_5$ and $W_6$ of the fifth transistor 35 and the sixth transistor 36, respectively, are set similar to the gate length and the gate width of the second transistor 32 of the conductivity type identical to the conductivity type of the fifth and sixth transistors, and $L_5=L_6=0.5$ micrometers (μm) and $W_5=W_6=0.5$ micrometers (μm).

A drain voltage $V_{ds5}$ of the fifth transistor 35 and a drain voltage $V_{ds6}$ of the sixth transistor 36 are $V_{ds5}=V_{ds6}=3.0$ V. A drain voltage $V_{ds2}$ of the second transistor 32 is $V_{ds2}=3.0$ V. The fifth transistor 35 and the sixth transistor 36 are brought into the ON-state when supplied with the selection signal of the third potential (V3) as the scan signal. Thus, a gate voltage $V_{gs5}$ of the fifth transistor 35 and a gate voltage $V_{gs6}$ of the sixth transistor 36 are $V_{gs5}=V_{gs6}=V3-V2=7.0$ V. On the other hand, a gate voltage $V_{gs2}$ of the second transistor 32 that turns the second transistor 32 into the ON-state is $V_{gs2}=V1-V2=3.0$ V.

Threshold voltages $V_{th5}$ and $V_{th6}$ of the fifth transistor 35 and the sixth transistor 36, respectively, are equal to the threshold voltages $V_{th1}$ and $V_{th2}$ of the first transistor 31 and the second transistor 32, respectively ($V_{th5}=V_{th6}=V_{th1}=V_{th2}=0.36$ V). Therefore, the gate voltages $V_{gs5}$ and $V_{gs6}$ of the fifth transistor 35 and the sixth transistor 36 with respect to the threshold voltage $V_{th5}$ and $V_{th6}$ may have a larger value than the gate voltages of the first transistor 31 and the second transistor 32. The fifth transistor 35 and the sixth transistor 36 may thus offer a lower ON-resistance than the first transistor 31 and the second transistor 32.

In the present exemplary embodiment, the ON-resistance of the fifth transistor 35 and the ON-resistance of the sixth transistor 36 were both $3.636 \times 10^3 \Omega$ in the ON-state. In contrast, the ON-resistance of the second transistor 32 was $9.145 \times 10^3 \Omega$. Furthermore, as described above, the ON-resistance of the first transistor 31 was $6.859 \times 10^3 \Omega$. Therefore, in the present exemplary embodiment, the ON-resistance of the fifth transistor 35 was smaller than half of the ON-resistance of the second transistor 32. Furthermore, the ON-resistance of the sixth transistor 36 was sufficiently smaller than the ON-resistance of the first transistor 31.

As described above, the fifth transistor 35 offers a lower ON-resistance than the second transistor 32 and the fourth transistor 34, included in the second inverter 62. Thus, a potential drop due to the ON-resistance of the fifth transistor 35 may be made smaller than a potential drop due to the ON-resistance of the second transistor 32 or the fourth transistor 34, when an image signal is supplied to the second inverter 62 through the data line 43. Furthermore, the sixth transistor 36 offers a lower ON-resistance than the first transistor 31 and the third transistor 33, included in the first inverter 61. Thus, a potential drop due to the ON-resistance of the sixth transistor 36 may be made smaller than a potential drop due to the ON-resistance of the first transistor 31 or the third transistor 33, when a complementary image signal is supplied to the first inverter 61 through the complementary data line 45. This allows writing of an image signal to the memory circuit 60 or rewriting of an image signal in the memory circuit 60 to be reliably achieved.

Method for Driving Pixel Circuit

Figure 9:
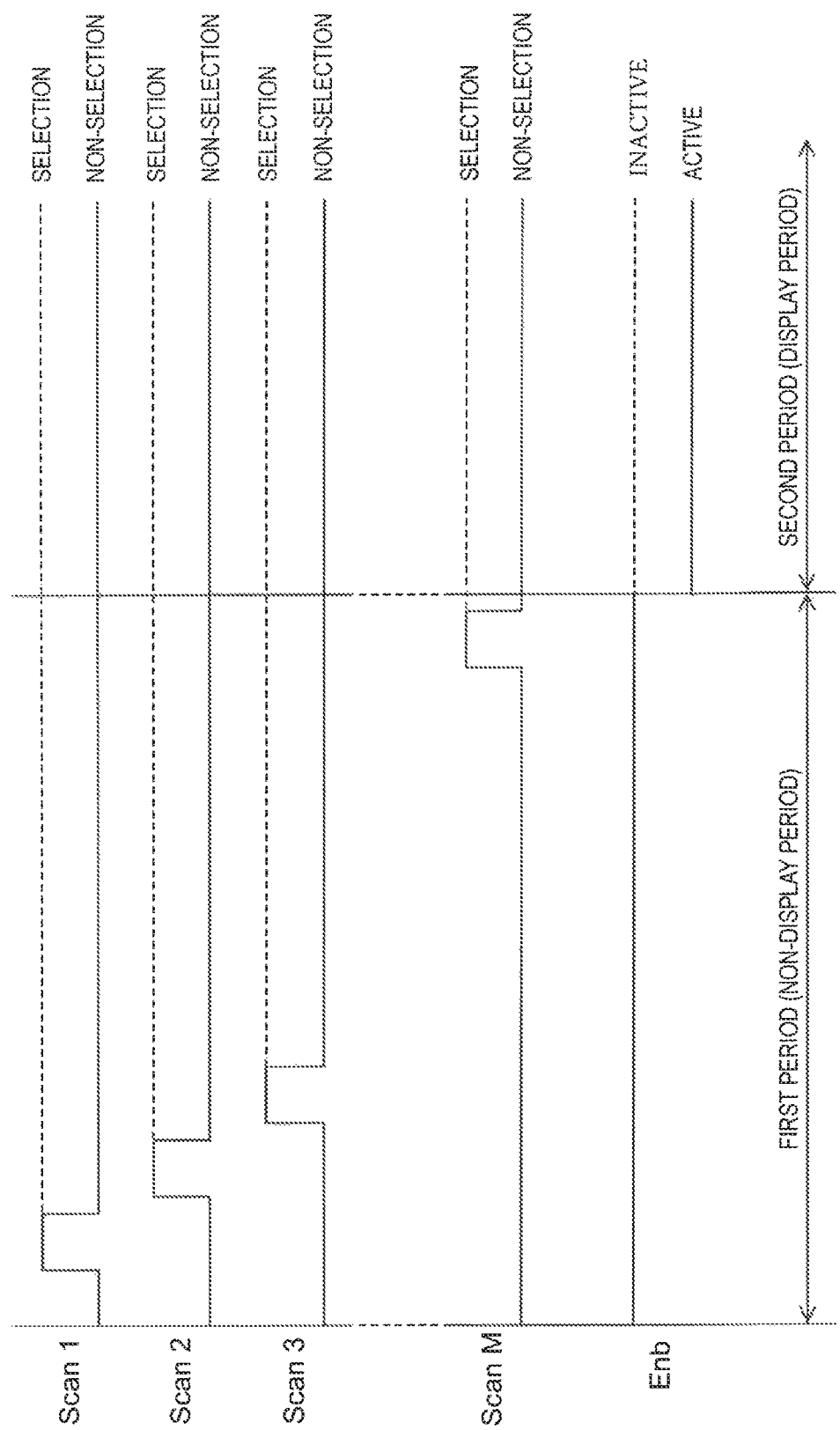
FIG. 9 is a diagram illustrating a method for driving a pixel circuit according to the present exemplary embodiment.

Next, a method for driving a pixel circuit in the electro-optical device 10 according to the present exemplary embodiment will be described with reference to FIG. 9. FIG. 9 is a diagram illustrating a method for driving a pixel circuit according to the present exemplary embodiment. In FIG. 9, the horizontal axis is a time axis and includes a first period that is a non-display period and a second period that is a display period. The first period is illustrated as P1-1 to P1-6 in FIG. 7, and corresponds to P1. The second period is illustrated as P2-1 to P2-6 in in FIG. 7, and corresponds to P2.

In the vertical axis in FIG. 9, Scan 1 to Scan M represent scan signals supplied to the respective scan lines 42 from the first row to the M-th row of the M scan lines 42 (see FIG. 5). The scan signal includes a selection signal that is the scan signal in the selection state and a non-selection signal that is the scan signal in the non-selection state. Furthermore, Enb represents a control signal supplied to the enable line 44 (see FIG. 5). The control signal includes an active signal that is the control signal in the active state and an inactive signal that is the control signal in the inactive signal.

As described with reference to FIG. 7, one field (F) during which a single image is displayed is divided into a plurality of subfields (SFs), and each of the subfields (SFs) includes the first period and the second period starting after the first period ends. The first period is the signal-writing period during which an image signal is written to the memory circuit 60 (see FIG. 8) in each of the pixel circuits 41 (see FIG. 5) located in the display region E. The second period is a period during which the light emitting element 20 (see FIG. 8) may emit light in each of the pixel circuits 41 located in the display region E.

As illustrated in FIG. 9, in the electro-optical device 10 according to the present exemplary embodiment, an inactive signal is supplied as the control signal to all of the enable lines 44 during the first period. When the inactive signal is supplied to the enable lines 44, the seventh transistors 37 (see FIG. 8) are brought into the OFF-state, such that the light emitting elements 20 in all of the pixel circuits 41 located in the display region E are prevented from emitting light.

During the first period, a selection signal is supplied as the scan signal to any of the scan lines 42 in each of the subfields (SFs). When the selection signal is supplied to the scan line 42, the fifth transistor 35 and the sixth transistor 36 (see FIG. 8) are brought into the ON-state in the selected pixel circuit 41. In this way, an image signal is written to the memory circuit 60 from the data line 43 and the complementary data line 45 (see FIG. 8) in the selected pixel circuit 41. In this way, the image signal is written to and stored in the memory circuit 60 in each pixel circuit 41 during the first period.

During the second period, an active signal is supplied to all of the enable lines 44 as the control signal. When the active signal is supplied to each enable line 44, the seventh transistor 37 is brought into the ON-state, thus allowing each light emitting element 20 in all of the pixel circuits 41 located in the display region E to emit light. During the second period, a non-selection signal for turning the fifth transistor 35 and the sixth transistor 36 into the OFF-state is supplied to all of the scan lines 42 as the scan signal. In this way, an image signal written in the subfield (SF) is maintained in the memory circuit 60 of each of the pixel circuits 41.

As described above, in the present exemplary embodiment, the first period, which is a non-display period, and the second period, which is a display period, may be controlled independently, such that gray-scale display can be provided based on digital time division driving. As a result, the second period can be set shorter than the first period, such that multi-gray-scale display can be achieved.

Furthermore, a control signal supplied to the enable line 44 can be shared among the plurality of pixel circuits 41, such that driving of the electro-optic device 10 can be facilitated. Specifically, in a case of digital driving without the first period, highly complicated driving is required to make the emission period shorter than one vertical period within which selection of each of the plurality of scan lines 42 is completed. In contrast, a control signal supplied to the enable line 44 is shared among the plurality of pixel circuits 41 in the present exemplary embodiment, such that the electro-optical device 10 can be easily driven by simply setting the second period to be short even when some subfields (SFs) have an emission period shorter than one vertical period in which selection of all the scan lines 42 is completed.

As described above, the configuration of the pixel circuit 41 according to the present exemplary embodiment can provide the electro-optical device 10 that can display a high-resolution, multi-gray-scale, and high-quality image at low power consumption, while operating at a higher speed and achieving brighter display.

Hereinafter, modification examples of the pixel circuit according to First Exemplary Embodiment will be described with reference to FIG. 8. In the description of the modification examples, differences from. First Exemplary Embodiment will be described.

MODIFICATION EXAMPLE 1

In First Exemplary Embodiment, the seventh transistor 37, which is a control transistor, is of the P-type. However, an N-type seventh transistor 37A may be provided and is hereinafter simply referred to as the seventh transistor 37A. The NY-type seventh transistor 37A is disposed on the low potential side with respect to the light emitting element 20. Specifically, the drain of the seventh transistor 37A is electrically connected to the cathode 23 of the light emitting element 20. The source of the seventh transistor 37A is electrically connected to the output terminal 27 of the first inverter 61. The anode 21 of the light emitting element 20 is electrically connected to the third potential line (high potential line 49).

Furthermore, the seventh potential (V7), which is the potential of the inactive signal, is set to a lower potential (Low) with respect to the source potential of the N-type seventh transistor 37A, and is preferably equal to the second potential (V2). Furthermore, the sixth potential (V6), which is the potential of the active signal, is set to a higher potential (High) with respect to a source potential of the seventh transistor 37A, and is preferably equal the third potential (V3).

MODIFICATION EXAMPLE 2

In First Exemplary Embodiment, the seventh transistor 37, which is a control transistor, may not be provided. In a case where the seventh transistor 37 is not provided, the light emitting element 20 and the first transistor 31 are disposed in series between the third potential line (high potential line 49) and the second potential line (low potential line 46). Therefore, when the potential of the output terminal 27 in the memory circuit 60 becomes Low (second potential), i.e., the gate potential of the first transistor 31 becomes High (first potential) to turn the first transistor 31 into the ON-state, the light emitting element 20 emits light.

Furthermore, in a case where the seventh transistor 37 is not provided, the enable line 44 is not needed through which the control signal is supplied, such that the number of wires and, thus, the number of wiring layers can be reduced. Since wiring layers are formed with interposed insulating layers, a large number of wiring layers may lead to an increased number of steps involved in the production process for the element substrate constituting the electro-optical device, and decreased production yields. The configuration lacking the seventh transistor 37 enables a reduction in the number of production steps and an increase in production yields. The configuration also decreases the number of light-shielding wirings, enabling a reduction of light-shielding areas. Thus, a higher resolution and pixel miniaturization can be achieved.

Second Exemplary Embodiment

Now, a configuration of an electro-optical device according to Second Exemplary Embodiment will be described. The electro-optical device according to Second Exemplary Embodiment differs from the electro-optical device 10 according to First Exemplary Embodiment in that the first transistor and the second transistor included in the memory circuit and the fifth transistor and the sixth transistor 36 are of the P-type and that the seventh transistor s of the N-type and that the second potential (V2) is higher than the first potential (V1) and the third potential (V3). Accordingly, the configuration of the pixel circuit according to Second Exemplary Embodiment also differs from the configuration of the pixel circuit according to First Exemplary Embodiment.

Hereinafter, the configuration of the pixel circuit according to Second Exemplary Embodiment will be described with reference to FIG. 10. Note that, in the following description, the differences from First Exemplary Embodiment will be described. The same components as those of First Exemplary Embodiment are designated by the same reference numerals in the drawings, and their description will be omitted.

Configuration of Pixel Circuit

Figure 10:
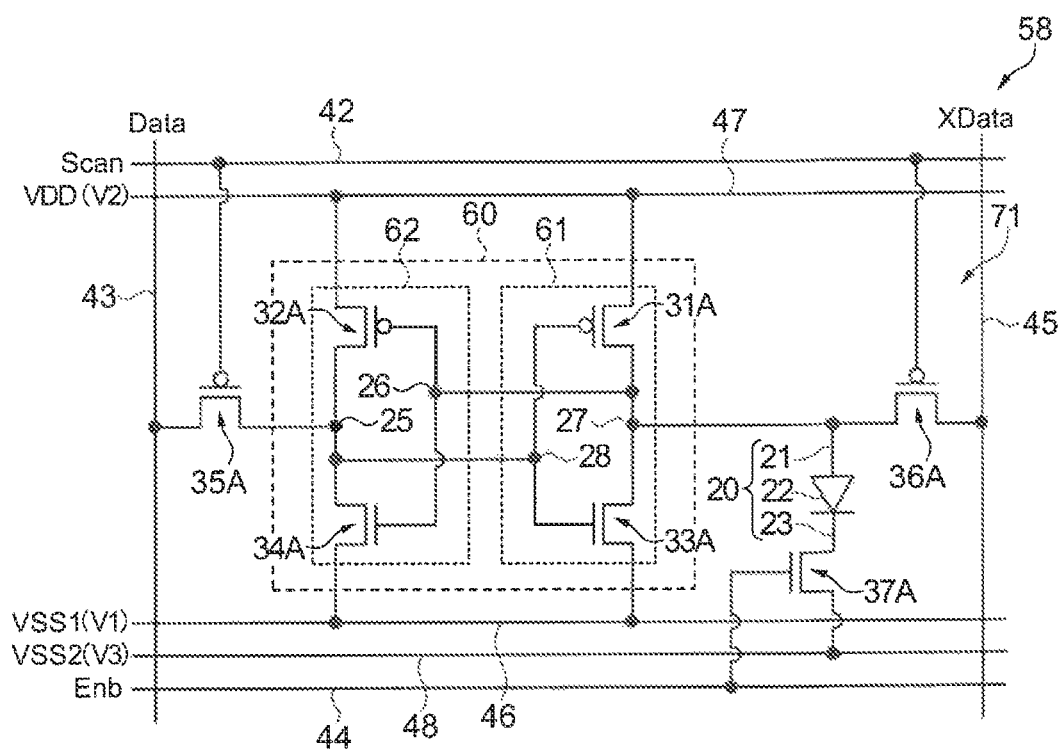
FIG. 10 is a diagram illustrating a configuration of a pixel circuit according to Second Exemplary Embodiment.

FIG. 10 is a diagram illustrating the configuration of the pixel circuit according to Second Exemplary Embodiment. As illustrated in FIG. 10, a pixel circuit 71 according to Second Exemplary Embodiment includes the light emitting element 20, the N-type seventh transistor 37A, the memory circuit 60, the P-type fifth transistor 35A, and a P-type sixth transistor 36A.

Note that the high potential and the low potential in First Exemplary Embodiment have respectively been changed to the low potential and the high potential in Second Exemplary Embodiment. Specifically, the first potential (V1) is a first low potential VSS1 (e.g., V1=VSS1=4.0 V), the second potential (V2) is a high potential VDD (e.g., V2=VDD=7.0 V), and the third potential (V3) is a second low potential VSS2 (e.g., V3=VSS2=0 V). Therefore, the first potential is lower than the second potential, and the third potential is lower than the first potential. In other words, an absolute value of a potential difference between the first potential (V1) and the second potential (V2) is smaller than an absolute value of a potential difference between the third potential (V3) and the second potential (V2).

In the present exemplary embodiment, the first potential (first low potential VSS1) and the second potential (high potential VDD) constitute a low-voltage power-supply, whereas the third potential (second low potential VSS2) and the second potential (high potential VDD) constitute a high-voltage power-supply. The second potential is a potential serving as a reference for the low-voltage power-supply and the high-voltage power-supply.

Furthermore, in Second Exemplary Embodiment, to each of the pixel circuits 71, the first potential (first low potential VSS1) is supplied from the low potential line 46 as a first potential line, the second potential (high potential VDD) is supplied from the high potential line 47 as a second potential line, and the third potential (second low potential VSS2) is supplied from the low potential line 48 as a third potential line.

The memory circuit 60 is disposed between the first potential line (low potential line 46) and the second potential line (high potential line 47). In Second Exemplary Embodiment, the first inverter 61 in the memory circuit 60 includes a first transistor 31A of the P-type as a first conductivity type and a third transistor 33A of the N-type as a second conductivity type. A source of the first transistor 31A is electrically connected to the second potential line (high potential line 47). A source of the third transistor 33A is electrically connected to the first potential line (low potential line 46).

The second inverter 62 includes a second transistor 32A of the P-type as the first conductivity type and a fourth transistor 34A of the N-type as the second conductivity type. A source of the second transistor 32A is electrically connected to the second potential line (high potential line 47). A source of the fourth transistor 34A is electrically connected to the first potential line (low potential line 46).

In Second Exemplary Embodiment, the first transistor 31A, the light emitting element 20, and the seventh transistor 37A are disposed in series between the second potential line (high potential line 47) and the third potential line (low potential line 48). A gate of the seventh transistor 37A is electrically connected to the enable line 44. A source of the seventh transistor 37A is electrically connected to the third potential line (low potential line 48). A drain of the seventh transistor 37A is electrically connected to the cathode 23 of the light emitting element 20. The anode 21 of the light emitting element 20 is electrically connected to the output terminal 27 of the first inverter 61, i.e., a drain of the first transistor 31A. The fifth transistor 35A is disposed between the memory circuit 60 and the data line 43. The sixth transistor 36A is disposed between the memory circuit 60 and the complementary data line 45.

In the pixel circuit 71 according to Second Exemplary Embodiment, the first transistor 31A and the seventh transistor 37A are of different conductivity types. The P-type first transistor 31A is disposed on the high potential side with respect to the light emitting element 20, and the N-type seventh transistor 37A is disposed on the low potential side with respect to the light emitting element 20. When the seventh transistor 37A and the first transistor 31A are brought into the ON-state, the light emitting element 20 may emit light. With the first transistor 31A and the seventh transistor 37A in the ON-state, electrical communication is established through a path leading from the second potential line (high potential line 47), through the first transistor 31A, the light emitting element 20 and the seventh transistor 37A, to the third potential line (low potential line 48), allowing a current to flow through the light emitting element 20.

In Second Exemplary Embodiment, the light emitting element 20 may emit light when the output terminal 27 of the first inverter 61 in the memory circuit 60 has the High potential, i.e., when the potential of the output terminal 25 of the second inverter 62 has the Low potential, and the light emitting element 20 emits no light when the output terminal 27 of the first inverter 61 has the Low potential, i.e. when the output terminal 25 of the second inverter 62 has the High potential.

Relationship between Each Potential and Threshold Voltage of Transistor

Also in Second Exemplary Embodiment, the first potential (V1) and the second potential (V2) constitute a low-voltage power-supply, and the third potential (V3) and the second potential (V2) constitute a high-voltage power-supply. The potential difference (V2−V1=7.0 V−4.0 V=3.0 V) between the second potential (V2) and the first potential (V1), which is the voltage of the low-voltage power-supply, is smaller than the potential difference (V2−V3=7.0 V−0 V=7.0 V) between the second potential (V2) and the third potential (V3), which is the voltage of the high-voltage power-supply (V2−V1<V2−V3).

Also in Second Exemplary Embodiment, the drive circuit 51 and the memory circuit 60 are driven by the low-voltage power-supply at a low voltage of V2−V1=3.0 V, such that the drive circuit 51 and the memory circuit 60 can be operated at a high speed. Then, the high-voltage power-supply causes the light emitting element 20 to emit light at a high voltage of V2−V3=7.0 V, such that the light emitting element 20 can be caused to emit light at high luminance. Furthermore, the first transistor 31A and the seventh transistor 37A disposed in series with the light emitting element 20 are linearly operated, such that most of high voltage of V2−V3=7.0 V can be applied to the light emitting element 20. Accordingly, luminance of the light emitting element 20 can be further increased.

In Second Exemplary Embodiment, the two inverters 61 and 62 constituting the memory circuit 60 are disposed between the first potential line (low potential line 46) and the second potential line (high potential line 47), and VSS1 as the first potential and VDD as the second potential are supplied to the two inverters 61 and 62. Therefore, Low corresponds to the first potential (VSS1), and High corresponds to the second potential (VDD).

In the present exemplary embodiment, the threshold voltage ($V_{th1}$) of the first transistor 31A, which is a driving transistor, is negative ($V_{th1}<0$). When an image signal stored in the memory circuit 60 corresponds to non-emission, the output terminal 27 of the first inverter 61 has the Low potential (first potential). At this time, the input terminal 28 of the first inverter 61, i.e., a gate of the first transistor 31A, has the High potential (second potential). The source of the first transistor 31A is connected to the second potential line (high potential line 47), and thus, a source potential of the first transistor 31A is the second potential (VDD). Consequently, the gate-source voltage $V_{gs1}$ of the first transistor 31 is of 0 V.

Therefore, when the gate-source voltage $V_{gs1}$ is 0 V with respect to the threshold voltage $V_{th1}$ of the first transistor 31A (by way of example, $V_{th1}=-0.36$ V), the gate-source voltage $V_{gs1}$ is greater than the threshold voltage $V_{th1}$. This turns the first transistor 31A into the OFF-state. Thus, the first transistor 31A can be reliably placed in the OFF-state when the image signal indicates non-emission.

When an image signal stored in the memory circuit 60 corresponds to emission, the potential of the output terminal 27 in the memory circuit 60 is High (second potential). At this time, the input terminal 28 of the first inverter 61, i.e., the gate of the first transistor 31A, has the Low potential (first potential). The source potential of the first transistor 31A is the second potential (V2), and thus, the gate-source voltage $V_{gs1}$ of the first transistor 31A is equal to the potential difference between the first potential (V1) and the second potential (V2) ($V_{gs1}=V1-V2=4.0$ V−7.0 V=−3.0 V). This makes the gate-source voltage $V_{gs1}$ of the first transistor 31A smaller than the threshold voltage $V_{th1}$, turning the first transistor 31A into the ON-state. Thus, the first transistor 31A can be reliably placed in the ON-state when the image signal indicates emission.

Also in Second Exemplary Embodiment, the inactive signal is supplied as the control signal to all of the enable lines 44 during the first period, which is a non-display period, and the seventh transistors 37A are brought into the OFF-state. As a result, the light emitting elements 20 are prevented from emitting light. When the selection signal is supplied as the scan signal to any of the scan lines 42 during the first period, the selected fifth transistor 35A and the selected sixth transistor 36A are brought into the ON-state and an image signal is written from the data line 43 and the complementary data line 45 to the memory circuit 60.

During the second period, which is a display period, the active signal is supplied to all the enable lines 44 as the control signal and the seventh transistors 37A are brought into the ON-state, allowing the light emitting element 20 to emit light. During the second period, a non-selection signal for turning the fifth transistors 35A and the sixth transistor 36A into the OFF-state is supplied to all of the scan lines 42 as the scan signal. As described above, also in Second Exemplary Embodiment, the first period, which is a non-display period, and the second period, which is a display period, can be controlled independently, such that gray-scale display can be achieved based on digital time division driving.

In Second Exemplary Embodiment, the seventh transistor 37A is of the N-type, and thus, the active signal, which is the control signal in the active state, has the high potential, and the inactive signal, which is the control signal in the inactive state, has the low potential. Specifically, the seventh potential (V7), which is the potential of the inactive signal, is set to a low potential lower than or equal to the third potential (V3) and is preferably equal to the third potential (V3). Furthermore, the sixth potential (V6), which is the potential of the active signal, is set to a high potential higher than or equal to V3+(V2−V1) and is preferably equal to the second potential (V2).

When the inactive signal of the third potential (V3) is supplied from the enable line 44 to the gate of the seventh transistor 37A, both of the source potential and the gate potential of the seventh transistor 37A are set to the third potential (V3) and the gate-source voltage $V_{gs7}$ of the seventh transistor 37A is set to 0 V. With the threshold voltage of the N-type seventh transistor 37A being $V_{th7}$ (by way of example, $V_{th7}$=0.36 V), the gate-source voltage $V_{gs7}$ of the seventh transistor 37A is smaller than the threshold voltage $V_{th7}$ and the seventh transistor 37A is in the OFF-state. Thus, the seventh transistor 37A can be reliably placed in the OFF-state when the control signal is the inactive signal.

When an active signal of a potential higher than or equal to V3+(V2−V1), i.e., higher than or equal to 0 V+(7.0 V−4.0 V)=3.0 V is supplied through the enable line 44, the gate-source voltage $V_{gs7}$ of the seventh transistor 37A is set higher than or equal to 3.0−0 V=3.0 V. Therefore, the gate-source voltage $V_{gs7}$ of the seventh transistor 37A is set sufficiently greater than the threshold voltage $V_{th7}$. This allows the seventh transistor 7A to be reliably brought into the ON-state when the control signal is the active signal.

The gate-source voltage $V_{gs7}$ of the seventh transistor 37A increases with increasing potential of the active signal. With the potential of the active signal set to the second potential (V2), the gate-source voltage $V_{gs7}$ of the seventh transistor 37A is set to V2−V3=7.0 V−0 V=7.0 V, and thus, the seventh transistor 37A offers a reduced ON-resistance in the ON-state. This makes the light emitting element 20 less susceptible to variations in the threshold voltage of the seventh transistor 37A during light emission from the light emitting element 20.

The fifth transistor 35A, which is a selecting transistor, is brought into the OFF-state when supplied with a non-selection signal as the scan signal from the scan line 42 electrically connected to a gate of the fifth transistor 35A, and into the ON-state when supplied with a selection signal as the scan signal. In Second Exemplary Embodiment, the fifth transistor 35A is of the P-type, and thus, the fifth potential (V5), which is the potential of the non-selection signal, is set to a high potential higher than or equal to the second potential (V2) and is preferably equal to the second potential (V2), as described above. Furthermore, the fourth potential (V4), which is the potential of the selection signal, is set to a low potential lower than or equal to the first potential (V1) and is preferably equal to the third potential (V3).

Also in Second Exemplary Embodiment, the first transistor 31A and the fifth transistor 35A are preferably of the identical polarity. In Second Exemplary Embodiment, the first transistor 31A and the fifth transistor 35A are both of the P-type. Therefore, the first transistor 31A is brought into the ON-state when the image signal supplied to the gate of the first transistor 31A has the Low potential, and the fifth transistor 35A is brought into the ON-state when the scan signal supplied to the gate of the fifth transistor 35A is the selection signal (Low). The Low potential of the image signal is the first potential (V1). However, the selection signal (Low) is set lower than or equal to the first potential (V1) and is preferably equal to the third potential (V3).

A case will be described where the selection signal is set equal to the third potential (V3) and where an image signal in the memory circuit 60 is rewritten from High to Low. The input terminal 28 of the first inverter 61, to which one of the source and the drain of the fifth transistor 35A is electrically connected, has the second potential (V2), which is High, before the image signal is rewritten. When the gate of the fifth transistor 35A is supplied with the selection signal of the third potential (V3) through the scan line 42, the gate-source voltage $V_{gs5}$ of the fifth transistor 35A is set to V3−V2=0 V−7.0 V=−7.0 V, which is lower than the threshold voltage $V_{th5}$ of the fifth transistor 35A (by way of example, $V_{th5}$=−0.36 V). This turns the fifth transistor 35A into the ON-state, When a Low (V1) image signal is written to the memory circuit 60 through the data line 43, the potential of the output terminal 28 of the first inverter 61 gradually decreases from High (V2) to Low (V1). Correspondingly, the absolute value of the gate-source voltage $V_{gs5}$ of the fifth transistor 35A gradually decreases to V3−V1=0 V−4.0 V=−4.0 V. Even when the gate-source voltage $V_{gs5}$ of the fifth transistor 35 reaches the largest value, i.e., −4.0 V, the gate-source voltage $V_{gs5}$ of the fifth transistor 35 is sufficiently lower than the threshold voltage $V_{th5}$ f the fifth transistor 35A. Thus, until the image signal is written to the memory circuit 60, the ON-resistance of the fifth transistor 35A remains low, allowing the image signal to be reliably written to the memory circuit 60.

Here, the fifth transistor 35A is assumed to be the fifth transistor 35 of the N-type, which is different from the conductivity type of the first transistor 31A. In this case, the fifth transistor 35 is in the ON-state when the selection signal is High. In a case where the selection signal is set to have the second potential (V2) and where an image signal in the memory circuit 60 is rewritten from Low to High, supply of the selection signal of the second potential (V2) through the scan line 42 sets the gate-source voltage $V_{gs5}$ of the fifth transistor 35 to V2−V1=7.0 V−4.0 V=3.0 V, which is higher than the threshold voltage $V_{th5}$ of the fifth transistor 35 (by way of example, $V_{th5}$=0.36 V). The fifth transistor 35 is thus brought into the ON-state.

When a High (V2) image signal is written to the memory circuit 60 through the data line 43, the potential of the input terminal 28 of the second inverter 62 gradually increases from Low (V1). Correspondingly, the gate-source voltage $V_{gs5}$ of the fifth transistor 35 gradually decreases from 3.0 V. The gate-source voltage $V_{gs5}$ reaches the threshold voltage $V_{th5}$ of the N-type fifth transistor 35 (e.g., 0.36 V) before the potential of the input terminal 28 reaches the second potential (V2), turning the fifth transistor 35 into the OFF-state.

Furthermore, before the fifth transistor 35 is brought into the OFF-state, the ON-resistance of the fifth transistor 35 increases as the gate-source voltage $V_{gs5}$ decreases and approaches the threshold voltage $V_{th5}$. This leads to a need for a long time for rewriting of an image signal in the memory circuit 60 or a failure in rewriting. To avoid this, the fourth potential (V4) of the selection signal gray be set to a smaller value. However, this results in a need for a further potential line with a potential different from the exiting potentials.

When the first transistor 31A and the fifth transistor 35A are of the P-type and thus have the identical polarity as in the present exemplary embodiment, the fourth potential (V4) of the selection signal may be set equal to the third potential (V3), which is the lowest potential between the third potential (V3) and the second potential (V2), without a need for a new potential line. When the fifth transistor 35A is brought into the ON-state to write an image signal to the memory circuit 60, the fifth transistor 35A may have an increased gate-source voltage $V_{gs5}$, allowing the ON-resistance of the fifth transistor 35A to be kept low even with an increase in the source potential of the fifth transistor 35A resulting from writing of the image signal. This also applies to the sixth transistor 36A, which is a complementary selecting transistor for the fifth transistor 35A. The sixth transistor 36A offers a lower ON-resistance than the first transistor 31A and the third transistor 33A. This allows writing of an image signal to the memory circuit 60 or rewriting of an image signal in the memory circuit 60 to be reliably achieved at a high speed.

Characteristics of Transistors

Now, characteristics of the transistors provided in the pixel circuit 71 according to Second Exemplary Embodiment will be described. Also in the pixel circuit 71 according to Second Exemplary Embodiment, the ON-resistance of each of the first transistor 31A and seventh transistor 37A disposed in series with the light emitting element 20 is preferably sufficiently lower than the ON-resistance of the light emitting element 20.

In the pixel circuit 71 according to Second Exemplary Embodiment, the first transistor 31A is of the P-type, and the seventh transistor 37A is of the N-type. In the above-described Expression 6, the gate width $W_i$, the gate length $L_i$, the mobility $\mu_i$, the gate voltage $V_{gs1}$, the potential drop (drain voltage) $V_{dsi}$, and the threshold voltage $V_{thi}$ are different from those for the pixel circuit 41 according to First Exemplary Embodiment.

In Second Exemplary Embodiment, in Expression 6 described above, $W_1$=1.5 micrometer (μm), $W_7$=1.0 micrometers (μm), $L_1$=$L_7$=0.75 micrometer), (μm), $\mu_1$=150 square centimeters per volt per second (cm²/V·s), $\mu_7$=240 square centimeters per volt per second (cm²/V·s), $V_{th1}$=−0.36 V, $V_{th7}$=0.36 V, $V_{gs1}$=V1−V2=−3.0 V, and $V_{gs7}$=V2−V3=7.0 V.

In Second Exemplary Embodiment, the voltage $V_p$ at which the light emitting element 20 emitted light was $V_p$=V2−V3=7.0 V, and the potential drop $V_{ds1}$ occurring at the first transistor 31A, the potential drop $V_{ds7}$ occurring at the seventh transistor 37A, and the voltage $V_{EL}$ applied to the light emitting element 20 were $V_{ds1}$=0.0056 V, $V_{ds7}$=0.0028 V, and $V_{EL}$=6.9916 V, respectively. In this case, the ON-resistance of the first transistor 31A was 7.316×$10^3$Ω, the ON-resistance of the seventh transistor 37A was 3.640×$10^3$Ω, and the ON-resistance of the light emitting element 20 was 9.120×$10^6$Ω.

Therefore, the ON-resistance of the first transistor 31A was approximately 1/1200 of the ON-resistance of the light emitting element 20, which is lower than 1/1000 of the ON-resistance of the light emitting element 20, and the ON-resistance of the seventh transistor 37A was approximately 1/2500 of the ON-resistance of the light emitting element 20, which is lower than 1/1000 of the ON-resistance of the light emitting element 20. In this manner, in Second Exemplary Embodiment, most of the voltage of the high-voltage power-supply was also applied to the light emitting element 20.

In Second Exemplary Embodiment, Expression 11 illustrated below may express a condition for preventing the potential of the output terminal 27 of the first inverter 61 from being higher than or equal to the logic-inversion potential even when the light emitting element 20 emits light. Note that, similar to First Exemplary Embodiment, a situation is assumed where the seventh transistor 37A offers an ON-resistance of zero, maximizing the likelihood of logical inversion.

[Expression 11]

$$V_2 - \frac{R_T}{R_{EL} + R_T} \cdot (V_2 - V_3) > \frac{V_1 + V_2}{2} \tag{11}$$

Expression 11 may be rearranged to obtain Expression 12 below;

[Expression 12]

$$(2V_3 - V_1 - V_2)R_T > (V_1 - V_2)R_{EL} \tag{12}$$

In Expression 12, $2V_3 - V_1 - V_2 = (V_3 - V_1) + (V_3 - V_2)$, and this value is inevitably negative. Thus, division of both sides of Expression 12 by $2V_3 - V1 - V_2$ changes an inequality sign in Expression 12. Expression 10 is then obtained as in the case of First Exemplary Embodiment. That is, also in Second Exemplary Embodiment, to prevent the potential of the output terminal 27 of the first inverter 61 from being higher than or equal to the logic-inversion potential even when the light emitting element 20 emits light, the gate length, the gate width, the drive conditions, and the like for the transistor may be set to satisfy the relationship in Expression 10. In the present exemplary embodiment, the gate length, the gate width, the drive conditions, and the like for the first transistor 31A may be set.

In the present exemplary embodiment, the ON-resistance of the first transistor 31A was 7.316×$10^3$Ω, and the ON-resistance of the light emitting element 20 was 9.120×$10^6$Ω. Thus, the right side of Expression 10 is equal to 2.487×$10^6$Ω, which is sufficiently greater than 7.316×$10^3$Ω on the left side, thus preventing the first inverter 61 from being logic-inversion even when the light emitting element 20 emits light. This allows the light emitting element 20 to reliably emit light when the light emitting element 20 is to emit light.

For the transistors included in the memory circuit 60 except the first transistor 31A, i.e., the transistors 32A, 33A, and 34A, the gate lengths $L_2$, $L_3$, and $L_4$ are such that $L_2=L_3=L_4=0.5$ micrometers (μm). The gate length L and the gate width $W_1$ of the P-type first transistor 31A described above are set to satisfy the relationship in Expression 10. Thus, when the gate width $W_3$ of the N-type third transistor 33A disposed in series with the first transistor 31A is calculated such that the logic-inversion potential of the first inverter 61 is the intermediate potential between the first potential and the second potential, the width $W_3=0.6$ micrometers (μm).

The gate width $W_2$ of the P-type second transistor 32A, included in the second inverter 62, is assumed to be $W_2=0.8$ micrometers (μm). The gate width $W_4$ of the N-type fourth transistor 34A, disposed in series with the second transistor 32A, is set to $W_4=0.5$ micrometers (μm) such that the logic-inversion potential of the second inverter 62 is the intermediate potential between the first potential and the second potential.

As described above, also in Second Exemplary Embodiment, the gate length. $L_1$ of the first transistor 31A, among the transistors included in the memory circuit 60, is larger than the gate lengths $L_2$, $L_3$, and $L_4$ of the other transistors 32A, 33A, and 34A, respectively. Thus, a large current causing the light emitting element 20 to emit light may be passed through the first transistor 31A, and the first transistor 31A may be less susceptible to destruction even in a case where the maximum voltage of the high-voltage power-supply is applied to the first transistor 31A. On the other hand, the gate lengths $L_2$, $L_3$, and $L_4$ of the other transistors 32A, 33A, and 34A for static storage operations are each smaller than the gate length $L_1$ of the first transistor 31A, thus allowing the memory circuit 60 to be miniaturized and operated at a high speed.

Furthermore, when the gate width $W_1$ of the first transistor 31A is larger than the gate width $W_2$ of the second transistor 32A of the conductivity type identical to the conductivity type of the first transistor 31A, the ON-resistance of the first transistor 31A may be prevented from increasing even when a large current flows through the first transistor 31A during light emission from the light emitting element 20. The gate width $W_3$ of the third transistor 33A is larger than the gate width $W_4$ of the fourth transistor 34A, and thus, the logic-inversion potential of the first inverter 61 and the logic-inversion potential of the second inverter 62 may each be the intermediate potential between the first potential and the second potential. This allows the first inverter 61 and the second inverter 62 to perform normal logical inversion operations.

Each of the P-type fifth transistor 35A and the P-type sixth transistor 36A is supplied with the first potential (V1) and the second potential (V2) as an image signal and a complementary image signal, respectively. Therefore, gate lengths $L_5$ and $L_6$ and gate widths $W_5$ and $W_6$ of the fifth transistor 35A and the sixth transistor 36A, respectively, are set similar to the gate length and the gate width of the second transistor 32A of the conductivity type identical to the conductivity type of the fifth and sixth transistors, and $L_5=L_6=0.5$ micrometers (μm) and $W_5=W_6=0.8$ micrometers (μm).

A drain voltage $V_{ds5}$ of the fifth transistor 35A and a drain voltage $V_{ds6}$ of the sixth transistor 36A are $V_{ds5}=V_{ds6}=-3.0$ V. A drain voltage $V_{ds2}$ of the second transistor 32A is $V_{ds2}=-3.0$ V. The fifth transistor 35A and the sixth transistor 36A are brought into the ON-state when supplied with the selection signal of the third potential (V3) as the scan signal. Thus, the gate voltage $V_{gs5}$ of the fifth transistor 35A and a gate voltage $V_{gs6}$ of the sixth transistor 36A are $V_{gs5}=V_{gs6}=V3-V2=-7.0$ V. On the other hand, a gate voltage $V_{gs2}$ of the second transistor 32A that turns the second transistor 32A into the ON-state is $V_{gs2}=V1-V2=-3.0$ V.

Threshold voltages $V_{th5}$ and $V_{th6}$ of the fifth transistor 35A and the sixth transistor 36A, respectively, are equal to the threshold voltages $V_{th1}$ and $V_{th2}$ of the first transistor 31A and the second transistor 32A, respectively ($V_{th5}=V_{th6}=V_{th1}=V_{th2}=-0.36$ V). Therefore, the absolute values of the gate voltages $V_{gs5}$ and $V_{gs6}$ of the fifth transistor 35A and the sixth transistor 36A with respect to the absolute values of the threshold voltage $V_{th5}$ and $V_{th6}$ may be larger than the absolute values of the gate voltages of the first transistor 31A and the second transistor 32A. The fifth transistor 35A and the sixth transistor 36A may thus offer a lower ON-resistance than the first transistor 31A and the second transistor 32A.

In Second Exemplary Embodiment, the ON-resistance of the fifth transistor 35A and the ON-resistance of the sixth transistor 36A were both $1636 \times 10^3 \Omega$ in the ON-state. In contrast, the ON-resistance of the second transistor 32A was $9.145 \times 10^3 \Omega$. Furthermore, as described above, the ON-resistance of the first transistor 31A was $7.316 \times 10^3 \Omega$. Therefore, in the present exemplary embodiment, the ON-resistance of the fifth transistor 35A was smaller than half of the ON-resistance of the second transistor 32A. Furthermore, the ON-resistance of the sixth transistor 36A was sufficiently smaller than half of the ON-resistance of the first transistor 31A.

Therefore, also in Second Exemplary Embodiment, a potential drop due to the ON-resistance of the fifth transistor 35A may be made smaller than a potential drop due to the ON-resistance of the second transistor 32A or the fourth transistor 34A, when an image signal is supplied to the second inverter 62 through the data line 43. Furthermore, a potential drop due to the ON-resistance of the sixth transistor 36A may be made smaller than a potential drop due to the ON-resistance of the first transistor 31A or the third transistor 33A, when a complementary image signal is supplied to the first inverter 61 through the complementary data line 45. This allows writing of an image signal to the memory circuit 60 or rewriting of an image signal in the memory circuit 60 to be reliably achieved.

Hereinafter, modification examples of the configuration of the pixel circuit according to Second Exemplary Embodiment will be described with reference to FIG. 10. In the following description of the modification examples, differences from Second Exemplary Embodiment will be described.

MODIFICATION EXAMPLE 3

In Second Exemplary Embodiment, the seventh transistor 37A, which is a control transistor, is of the N-type. However, the seventh transistor 37A may be of the P-type. The seventh transistor 37A is thereinafter simply referred to as the seventh transistor 37. The P-type seventh transistor 37 is disposed on the high potential side with respect to the light emitting element 20. Specifically, the source of the seventh transistor 37 is electrically connected to the output terminal 27 of the first inverter 61. The drain of the seventh transistor 37 is electrically connected to the anode 21 of the light emitting element 20. The cathode 23 of the light emitting element 20 is electrically connected to the third potential line (low potential line 48).

Furthermore, the seventh potential (V7), which is the potential of the inactive signal, is set to a higher potential (High) with respect to the source potential of the P-type seventh transistor 37, and is preferably equal to the second potential (V2). Moreover, the sixth potential (V6), which is the potential of the active signal, is set to a lower potential (Low) with respect to a source potential of the seventh transistor 37, and is preferably equal the third potential (V3).

MODIFICATION EXAMPLE 4

In Second Exemplary Embodiment, the seventh transistor 37A, which is a control transistor, may not be provided. In a case where the seventh transistor 37A is not provided, the light emitting element 20 and the first transistor 31A are disposed in series between the third potential line (low potential line 48) and the second potential line (high potential line 47). Thus, when the potential of the output terminal 27 in the memory circuit 60 becomes High (second potential), i.e., the gate potential of the first transistor 31A becomes Low (first potential) to turn the first transistor 31A into the ON-state, the light emitting element 20 emits light.

The above-described exemplary embodiments and modification examples merely illustrate one aspect of the invention, and any variation and application may be possible within the scope of the invention. For example, the followings are modified examples other than those described above.

MODIFICATION EXAMPLE 5

In the pixel circuits of the above-described exemplary embodiments and modification examples, the fifth transistor 35 is disposed between the input terminal 28 of the first inverter 61 in the memory circuit 60 and the data line 43, and the sixth transistor 36 is disposed between the input terminal 26 of the second inverter 62 in the memory circuit 60 and the complementary data line 45. However, the invention is not limited to such a construction. The fifth transistor 35 may be disposed between the input terminal 26 of the second inverter 62 and the data line 43, and the sixth transistor 36 may be disposed between the input terminal 28 of the first inverter 61 and the complementary data line 45.

MODIFICATION EXAMPLE 6

While the memory circuit 60 includes the two inverters 61 and 62 in the pixel circuits of the above-described exemplary embodiments and modification examples, the invention is not limited to such construction. The memory circuit 60 may include an even number of two or more inverters.

MODIFICATION EXAMPLE 7

In the above-described exemplary embodiments and modification examples, the electro-optical device has been described by taking, as an example, the organic EL device in which the light emitting elements 20 formed of organic EL elements are aligned in 720 rows×3840 (1280×3) columns on the element substrate 11 formed of a single crystal silicon wafer that is a single crystal semiconductor substrate. However, the electro-optical device in the invention is not limited to such a construction. For example, the electro-optical device may include a Thin Film Transistor (TFT) as each transistor formed on the element substrate 11 formed of a glass substrate, or the electro-optical device may include a TFT on a flexible substrate formed of polyimide and the like. Furthermore, the electro-optical device may be a micro LED display in which fine LED elements are aligned as light-emitting elements in high density or a quantum dots display in which a nanosized semiconductor crystal material is used for the light-emitting element. Furthermore, a quantum dot that converts incident light into light having a different wavelength may be used as a color filter.

MODIFICATION EXAMPLE 8

While the electronic apparatus has been described in the above-described exemplary embodiments by taking, as an example, the see-through head-mounted display 100 incorporating the electro-optical device 10, the electro-optical device 10 of the invention is also applicable to other electronic apparatuses including a closed-type head-mounted display. Other types of electronic apparatus include, for example, projectors, rear-projection televisions, direct-viewing televisions, cell phones, portable audio devices, personal computers, video camera monitors, automotive navigation devices, head-up displays, pagers, electronic organizers, calculators, wearable devices such as wristwatches, handheld displays, word processors, workstations, video phones, POS terminals, digital still cameras, signage displays, and the like.

The entire disclosure of Japanese Patent Application No. 2017-250718, filed Dec. 27, 2017 is expressly incorporated by reference herein.

What is claimed is:
1. An electro-optical device comprising:
a scan line;
a data line;
a first potential line supplying a first potential;
a second potential line supplying a second potential;
a third potential line supplying a third potential;
a pixel circuit located at a position corresponding to an intersection of the scan line and the data line, the pixel circuit including a light-emitting element and a memory circuit, the memory circuit includes a first inverter that includes a first transistor, and the memory circuit is disposed between the first potential line and the second potential line;
a source of the first transistor electrically connected to the second potential line;
a drain of the first transistor, and the light-emitting element disposed between the drain of the first transistor and the third potential line; and
A<B, wherein
A is an absolute value of a potential difference between the first potential and the second potential, and
B is an absolute value of a potential difference between the third potential and the second potential, and
wherein
the first transistor is of a first conductivity type, and
the memory circuit includes the first inverter and a second inverter, the second inverter includes a second transistor of the first conductivity type.
2. The electro-optical device according to claim 1, wherein
Expression 1 is satisfied, wherein
$V_1$ is the first potential,
$V_2$ is the second potential,
$V_3$ is the third potential,
$R_T$ is an ON-resistance of the first transistor, and
$R_{EL}$ is a resistance of the light-emitting element during light is emitted from the light-emitting element:

[Expression 1]

$$R_T < \frac{V_1 - V_2}{2V_3 - V_1 - V_2} \cdot R_{EL}$$

3. The electro-optical device according to claim 1, wherein
a gate width of the first transistor is larger than a gate width of the second transistor.

4. The electro-optical device according to claim 1, wherein
the first inverter includes a third transistor of a second conductivity type different from the first conductivity type,
the second inverter includes a fourth transistor of the second conductivity type, and
a gate width of the third transistor is larger than a gate width of the fourth transistor.

5. The electro-optical device according to claim 4, further comprising
a fifth transistor disposed between the data line and an output of the second inverter, wherein
an ON-resistance of the fifth transistor is lower than an ON-resistance of the second transistor and the fourth transistor.

6. The electro-optical device according to claim 5, further comprising:
a complementary data line; and
a sixth transistor disposed between the complementary data line and an output of the first inverter, wherein
a gate of a fifth transistor and a gate of the sixth transistor are electrically connected to the scan line,
a potential of a scan signal supplied to the scan line is a fourth potential, and
an absolute value of a potential difference between the fourth potential and the second potential is larger than an absolute value of a potential difference between the first potential and the second potential.

7. The electro-optical device according to claim 6, wherein
the third potential is equal to the fourth potential.

8. The electro-optical device according to claim 4, further comprising:
a fifth transistor;
a complementary data line; and
a sixth transistor disposed between the complementary data line and an output of the first inverter, wherein
an ON-resistance of the sixth transistor is lower than an ON-resistance of the first transistor and the third transistor.

9. The electro-optical device according to claim 1, wherein
the first inverter includes a third transistor,
the second inverter includes a fourth transistor of a second conductivity type different from the first conductivity type, and
a gate length of the first transistor is larger than a gate length of at least one of the second transistor and the fourth transistor.

10. An electronic apparatus comprising the electro-optical device according to claim 1.

* * * * *